United States Patent
Feng et al.

(10) Patent No.: US 11,935,484 B2
(45) Date of Patent: Mar. 19, 2024

(54) DISPLAY PANEL AND DISPLAY APPARATUS

(71) Applicants: Hefei BOE Joint Technology Co., Ltd., Anhui (CN); BOE TECHNOLOGY GROUP CO., LTD., Beijing (CN)

(72) Inventors: Xuehuan Feng, Beijing (CN); Yongqian Li, Beijing (CN)

(73) Assignees: Hefei BOE Joint Technology Co., Ltd., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 206 days.

(21) Appl. No.: 17/642,983

(22) PCT Filed: Oct. 23, 2020

(86) PCT No.: PCT/CN2020/123121
§ 371 (c)(1),
(2) Date: Mar. 15, 2022

(87) PCT Pub. No.: WO2022/082703
PCT Pub. Date: Apr. 28, 2022

(65) Prior Publication Data
US 2023/0154410 A1    May 18, 2023

(51) Int. Cl.
*G09G 3/3266* (2016.01)
*G09G 3/3233* (2016.01)
(Continued)

(52) U.S. Cl.
CPC ......... *G09G 3/3266* (2013.01); *G09G 3/3233* (2013.01); *G11C 19/28* (2013.01);
(Continued)

(58) Field of Classification Search
CPC ......... G09G 2310/0286; G09G 3/3233; G09G 3/3266
See application file for complete search history.

(56) References Cited

U.S. PATENT DOCUMENTS

| | | |
|---|---|---|
| 2016/0187707 A1 | 6/2016 | Cao et al. |
| 2016/0274431 A1 | 9/2016 | Du |

(Continued)

FOREIGN PATENT DOCUMENTS

| | | |
|---|---|---|
| CN | 203644373 U | 6/2014 |
| CN | 103943058 B | 4/2017 |

(Continued)

OTHER PUBLICATIONS

Xu Hongxia, "Study on Amorphous InGaZnO Thin Film Transistors Integrated Gate Driving Circuits for Liquid Crystal Displays", Dissertation Submitted to Shanghai Jiao Tong University for the Degree of Master, Jul. 2019, 71 pages.

(Continued)

*Primary Examiner* — Robin J Mishler
(74) *Attorney, Agent, or Firm* — Dority & Manning, PA

(57) ABSTRACT

A display panel includes a plurality of rows of sub-pixels and at least one gate driver circuit that are disposed on a base substrate. Each sub-pixel includes a pixel driver circuit and a light-emitting device coupled to the pixel driver circuit, and a gate driver circuit includes a plurality of shift registers that are cascaded and a plurality of control signal lines. A shift register is coupled to a plurality of pixel driver circuits in at least one row of sub-pixels and at least a part of the plurality of control signal lines, and includes a plurality of first thin film transistors that are divided into a plurality of first thin film transistors. At least one thin film transistor group is located in the display region and distributed between adjacent sub-pixels in a same row of sub-pixels.

20 Claims, 17 Drawing Sheets

(51) Int. Cl.
*G11C 19/28* (2006.01)
*H10K 59/131* (2023.01)

(52) U.S. Cl.
CPC ... *H10K 59/131* (2023.02); *G09G 2300/0426* (2013.01); *G09G 2300/0842* (2013.01); *G09G 2310/0286* (2013.01); *G09G 2330/021* (2013.01)

(56) References Cited

U.S. PATENT DOCUMENTS

| | | | |
|---|---|---|---|
| 2016/0329021 A1* | 11/2016 | Nagayama | G09G 3/36 |
| 2017/0110073 A1 | 4/2017 | Xu | |
| 2017/0229082 A1 | 8/2017 | Du | |
| 2017/0242311 A1 | 8/2017 | Li et al. | |
| 2018/0224982 A1 | 8/2018 | Gong | |
| 2020/0020295 A1 | 1/2020 | Han et al. | |
| 2021/0259086 A1 | 8/2021 | Xu et al. | |
| 2022/0036788 A1 | 2/2022 | Shi et al. | |

FOREIGN PATENT DOCUMENTS

| | | |
|---|---|---|
| CN | 210575035 U | 5/2020 |
| CN | 111292664 A | 8/2022 |
| KR | 20110067227 A | 6/2011 |

OTHER PUBLICATIONS

Yanbing Qiao, "Integrated Gate Driver Based on Organic Thin Film Transistor for Electrophoretic Display", Dissertation Submitted to Shanghai Jiao Tong University for the Degree of Master, Jul. 2015, 66 pages.

* cited by examiner

DISPLAY PANEL AND DISPLAY APPARATUS

CROSS-REFERENCE TO RELATED APPLICATION

This application is a national phase entry under 35 USC 371 of International Patent Application No. PCT/CN2020/123121 filed on Oct. 23, 2020, which is incorporated herein by reference in its entirety.

TECHNICAL FIELD

The present disclosure relates to the field of display technologies, and in particular, to a display panel and a display apparatus.

BACKGROUND

As the resolution of display apparatuses becomes higher and higher, the display apparatuses with narrow bezels or even without bezels have become a current development trend, and a plurality of types of display panels have emerged, such as full screens and water-drop screens.

SUMMARY

In an aspect, a display panel is provided, and the display panel has a display region. The display panel includes a base substrate, a plurality of rows of sub-pixels, and at least one gate driver circuit. The plurality of rows of sub-pixels are disposed on the base substrate and located in the display region. Each row of sub-pixels includes a plurality of sub-pixels, and each sub-pixel includes a pixel driver circuit and a light-emitting device coupled to the pixel driver circuit. The at least one gate driver circuit is disposed on the base substrate, and a gate driver circuit includes a plurality of shift registers that are cascaded and a plurality of control signal lines. A shift register is coupled to a plurality of pixel driver circuits in at least one row of sub-pixels and at least a part of the plurality of control signal lines. The shift register is configured to provide at least one gate signal to the plurality of pixel driver circuits under control of control signal lines coupled to the shift register. The shift register includes a plurality of first thin film transistors, the plurality of first thin film transistors are classified into a plurality of thin film transistor groups, and at least one thin film transistor group is located in the display region and distributed between adjacent sub-pixels in a same row of sub-pixels.

In some embodiments, at least one of the plurality of control signal lines is located in the display region and in a region outside regions occupied by pixel driver circuits in the display region.

In some embodiments, at least one of the plurality of control signal lines is located between two adjacent columns of sub-pixels, and a column of sub-pixels includes sub-pixels with a same arrangement order in the rows of sub-pixels.

In some embodiments, at least two of the plurality of control signal lines are located in the display region and in a region outside regions occupied by pixel driver circuits in the display region, and at least one sub-pixel is disposed between any two of the at least two control signal lines.

In some embodiments, each of the thin film transistor groups included in the shift register is located between adjacent sub-pixels in the same row of sub-pixels, and at least one sub-pixel is disposed between any two thin film transistor groups in an extension direction of a row of sub-pixels.

In some embodiments, in the at least one thin film transistor group and the at least one control signal line that are located in the display region, a thin film transistor group and a control signal line have at least one sub-pixel therebetween.

In some embodiments, the display panel further includes a plurality of connection lines corresponding to a row of sub-pixels.

A connection line is coupled to at least two thin film transistor groups in a shift register coupled to pixel driver circuits in the row of sub-pixels, or coupled to one control signal line and at least one thin film transistor group that is in a shift register coupled to pixel driver circuits in the row of sub-pixels.

In some embodiments, in thin film transistor groups in two adjacent shift registers, two thin film transistor groups are arranged in a column and distributed on opposite sides of a connection line, and the two thin film transistor groups belong to different shift registers.

In some embodiments, the display panel further includes at least one electrostatic discharge pattern and at least one second thin film transistor. The second thin film transistor includes a gate, a first electrode and a second electrode, the first electrode of the second thin film transistor is coupled to a control signal line, and the second electrode of the second thin film transistor is coupled to an electrostatic discharge pattern.

In some embodiments, the at least one second thin film transistor includes a plurality of second thin film transistors, first electrodes of the plurality of second thin film transistors are coupled to different control signal lines, and second electrodes of the plurality of second thin film transistors are coupled to a same electrostatic discharge pattern.

In some embodiments, the at least one electrostatic discharge pattern includes a plurality of electrostatic discharge patterns, the at least one second thin film transistor includes a plurality of second thin film transistors, and an electrostatic discharge pattern is at least coupled to one second thin film transistor.

Ends of the plurality of electrostatic discharge patterns are configured to be coupled to a same fixed voltage terminal to discharge static electricity on the electrostatic discharge patterns.

In some embodiments, a width of a channel region of the second thin film transistor is in a range of 4 μm to 10 μm, inclusive, and a length of the channel region of the second thin film transistor is in a range of 100 μm to 300 μm, inclusive.

In some embodiments, no control signal line is disposed between any two thin film transistor groups.

In some embodiments, a control signal line is coupled to at least one thin film transistor group, no other thin film transistor groups and/or other control signal lines are disposed between the control signal line coupled to the at least one thin film transistor group and the at least one thin film transistor group.

In some embodiments, each row of sub-pixels is divided into a plurality of display units, each display unit includes at least two sub-pixels.

Each thin film transistor group, located in the display region, of the shift register is located between adjacent display units.

In some embodiments, in a case where at least one of the plurality of control signal lines is located in the display region and in a region outside regions occupied by pixel driver circuits in the display region, at least one of the plurality of control signal lines is located between two adjacent columns of display units, and a column of display units includes display units with a same arrangement order in rows of display units.

In some embodiments, light emitted by the light-emitting device exits through the base substrate.

An orthographic projection, on the base substrate, of a portion of the gate driver circuit located in the display region does not overlap with orthographic projections, on the base substrate, of the light-emitting device and the pixel driver circuit.

In some embodiments, in the two adjacent rows of sub-pixels, light-emitting devices in different rows are adjacent, or pixel driver circuits in different rows are adjacent. The connection lines are located between different rows of light-emitting devices in the two adjacent rows of sub-pixels.

In some embodiments, shift registers in two adjacent rows share at least one of the plurality of connection lines.

In some embodiments, the at least one thin film transistor group includes multiple first thin film transistors, and the multiple first thin film transistors are arranged in a column.

In some embodiments, the display panel further includes power supply voltage signal lines and data signal lines. A power supply voltage signal line and a data signal line are coupled to the pixel driver circuit, and are configured to provide a power supply voltage signal and a data signal respectively to the pixel driver circuit. The plurality of thin film transistor groups are located in the display region and each are distributed between adjacent sub-pixels in the same row of sub-pixels, and the plurality of thin film transistor groups include at least one thin film transistor group, in which one or more first thin film transistors are used as one or more output transistors in the shift register.

A spacing between the power supply voltage signal line and a thin film transistor group containing the one or more first thin film transistors used as the one or more output transistors is less than a spacing between the data signal line and the thin film transistor group containing the one or more first thin film transistors used as the one or more output transistors.

In some embodiments, the at least one thin film transistor group, in which the one or more first thin film transistors are used as the one or more output transistors, includes multiple thin film transistor groups, each thin film transistor group includes a single first thin film transistor used as an output transistor, and first thin film transistors in the multiple thin film transistor groups are connected in parallel.

In some embodiments, the plurality of thin film transistor groups located in the display region and each distributed between the adjacent sub-pixels in the same row of sub-pixels further include at least one thin film transistor group, in which one or more first thin film transistors are used as one or more power control transistors.

In the plurality of shift registers that are cascaded, all thin film transistor groups each containing the one or more first thin film transistors used as the one or more power control transistors are distributed in a column.

In some embodiments, in an extension direction of a row of sub-pixels, spacings between at least one thin film transistor group and two sub-pixels located on opposite sides of the at least one thin film transistor group are unequal.

In some embodiments, the shift register further includes at least one capacitor, and the at least one capacitor is located in the display region and distributed between adjacent sub-pixels in the same row of sub-pixels.

In some embodiments, in an extension direction of a row of sub-pixels, spacings between the at least one capacitor and two sub-pixels located on opposite sides of the at least one capacitor are substantially same.

In another aspect, a display apparatus is provided. The display apparatus includes the display panel as described in any of the above embodiments.

BRIEF DESCRIPTION OF THE DRAWINGS

In order to describe technical solutions in the present disclosure more clearly, the accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product, an actual process of a method and an actual timing of a signal to which the embodiments of the present disclosure relate.

DETAILED DESCRIPTION

Figure 1A:
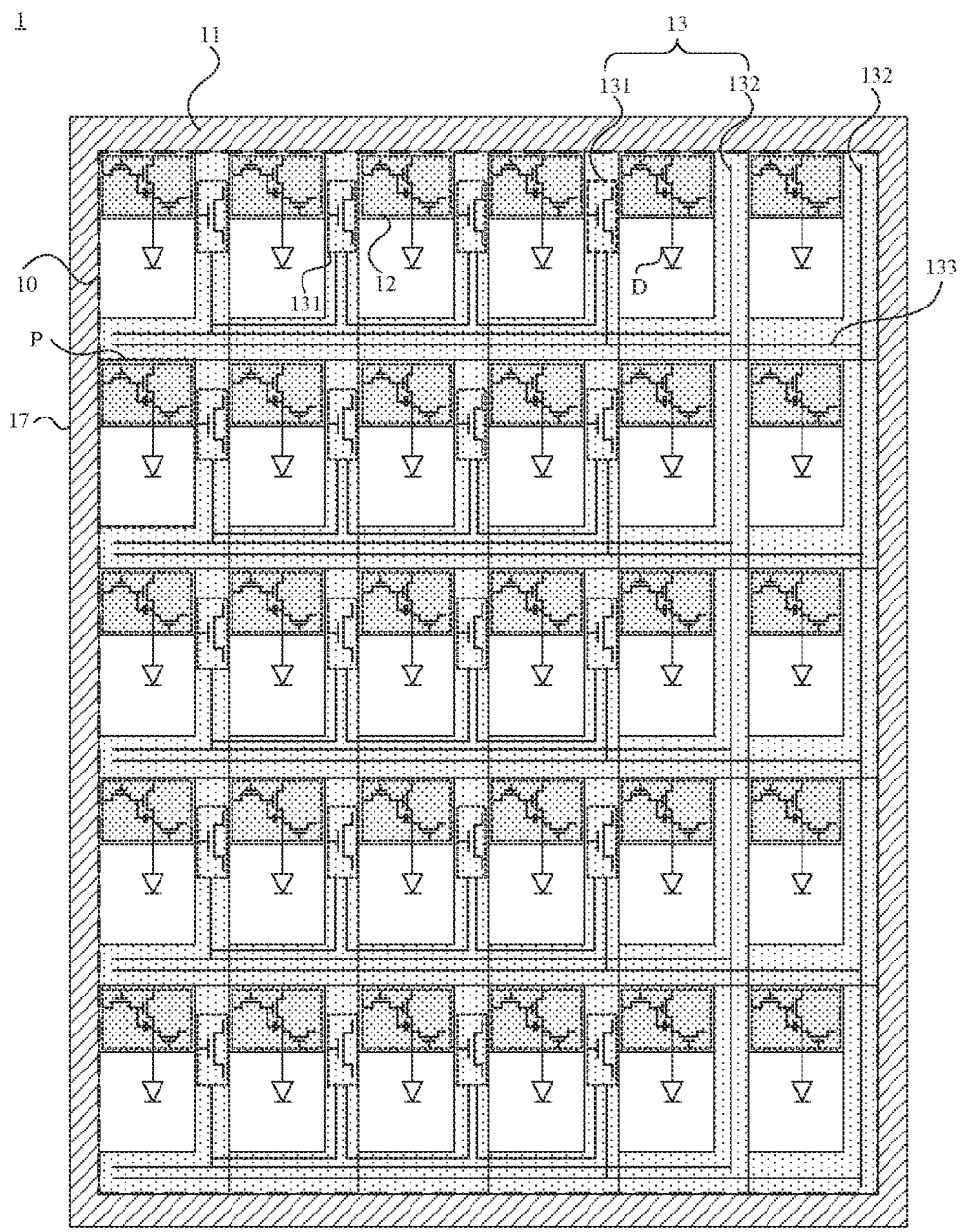
FIG. 1A is a diagram showing a structure of a display panel, in accordance with some embodiments of the present disclosure.

Technical solutions in some embodiments of the present disclosure will be described clearly and completely below with reference to the accompanying drawings. Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning; i.e., "including, but not limited to." In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials; or characteristics may be included in any one or more embodiments or examples in any suitable manner.

Below, the terms "first" and "second" are only used for descriptive purposes, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of", "the plurality of" or "multiple" means two or more unless otherwise specified.

In the description of some embodiments, the terms "coupled" and "connected" and their extensions may be used. For example, the term "connected" may be used in the description of some embodiments to indicate that two or more components are in direct physical or electrical contact with each other. As another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if" is optionally construed as "when" or "upon" or "in response to determining that" or "in response to detecting," depending on the context. Similarly, the phrase "if it is determined that" or "if [a stated condition or event] is detected" is optionally construed as "in a case where it is determined that" or "in response to determining" or "in a case of detecting [the stated condition or event]" or "in response to detecting [the stated condition or event]", depending on the context.

The use of the phrase "applicable to" or "configured to" herein means an open and inclusive language, which does not exclude devices that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

Terms such as "about" or "approximately" as used herein include a stated value and an average value within an acceptable range of deviation of a particular value. The acceptable range of deviation is determined by a person of ordinary skill in the art in view of the measurement in question and errors associated with the measurement of a particular quantity (i.e., the limitations of the measurement system).

As used herein, a "first electrode" is, for example, a source of a thin film transistor, and a "second electrode" is, for example, a drain of the thin film transistor, and vice versa.

As used herein, the same reference numerals may denote signal lines and signal terminals, and may also denote signals corresponding to the signal lines and the signal terminals.

Exemplary embodiments are described herein with reference to sectional views and/or plan views as idealized exemplary drawings. In the accompanying drawings, thicknesses of layers and sizes of regions are enlarged for clarity. Variations in shapes with respect to the accompanying drawings due to, for example, manufacturing technologies and/or tolerances may be envisaged. Therefore, the exemplary embodiments should not be construed as being limited to the shapes of the regions shown herein, but including deviations in shapes due to, for example, manufacturing. For example, an etched region shown in a rectangular shape generally has a curved feature. Therefore, the regions shown in the accompanying drawings are schematic in nature, and their shapes are not intended to show actual shapes of the regions in an apparatus, and are not intended to limit the scope of the exemplary embodiments.

The embodiments of the present disclosure provide a display apparatus, and the display apparatus may be, for example, any of a liquid crystal display (LCD), an organic light-emitting diode (OLED) display apparatus, or a quantum dot light-emitting diode (QLED) display apparatus.

A structure of the display apparatus will be described below by taking an example in which the display apparatus is the OLED display apparatus.

As shown in FIG. 1A, the display apparatus includes, for example, a display panel 1, and the display panel 1 has a display region 10 and a non-display region 11. For example, the non-display region 11 surrounds the display region 10.

The display panel 1 includes a base substrate 17, and a plurality of sub-pixels P and at least one gate driver circuit 13 that are disposed on the base substrate 17.

The plurality of sub-pixels P are arranged in a matrix of a plurality of rows and a plurality of columns in the display region 10 on the base substrate. Each sub-pixel P includes a pixel driver circuit 12 and a light-emitting device D coupled to the pixel driver circuit 12, and the pixel driver circuit 12 is configured to drive the light-emitting device D coupled thereto to emit light.

The pixel driver circuit 12 is, for example, a 2T1C-type pixel driver circuit, a 3T1C-type pixel driver circuit, or a 7T1C-type pixel driver circuit. T represents a thin film transistor (TFT), C represents a storage capacitor. The 2T1C-type pixel driver circuit is a pixel driver circuit 12 including two TFTs and one storage capacitor Cst, the 3T1C-type pixel driver circuit is a pixel driver circuit 12 including three TFTs and one storage capacitor Cst, and the 7T1C-type pixel driver circuit is a pixel driver circuit 12 including seven TFTs and one storage capacitor Cst. A structure and an operating principle of the pixel driver circuit 12 will be described below by taking an example in which the pixel driver circuit 12 is the 3T1C-type pixel driver circuit.

Referring to 1B, the pixel driver circuit 12 includes a thin film transistor T1, a thin film transistor T2, a thin film transistor T3, and a storage capacitor Cst, and the thin film transistor T3 is a driving transistor. A gate of the thin film transistor T1 is coupled to a first gate signal terminal G1, a first electrode of the thin film transistor T1 is coupled to a data signal terminal Data, and a second electrode of the thin film transistor T1 is coupled to a node G. A gate of the thin film transistor T2 is coupled to a second gate signal terminal G2, a first electrode of the thin film transistor T2 is coupled to a sensing signal terminal Sense, and a second electrode of the thin film transistor T2 is coupled to a node S. A gate of the thin film transistor T3 is coupled to the node G, a first electrode of the thin film transistor T3 is coupled to a power supply voltage signal terminal ELVDD, and a second electrode of the thin film transistor T3 is coupled to the node S. An anode of the light-emitting device D is coupled to the node S, and a cathode of the light-emitting device D is coupled to another power supply voltage signal terminal ELVSS. One end of the storage capacitor Cst is coupled to the node G, and another end of the storage capacitor Cst is coupled to the node S. The first gate signal terminal G1 is configured to receive a first gate signal, and the second gate signal terminal G2 is configured to receive a second gate signal. The data signal terminal Data is configured to receive data signals, and the data signals include, for example, a detection data signal and a display data signal. The power supply voltage signal terminal ELVDD is configured to receive a power supply voltage signal, and a voltage of the power supply voltage signal received by the power supply voltage signal terminal ELVDD is, for example, in a range of −5 V to 5 V, inclusive. The power supply voltage signal terminal ELVSS is configured to receive a power supply voltage signal, and the power supply voltage signal received by the power supply voltage signal terminal ELVSS is, for example, a fixed voltage signal, such as a voltage signal with a voltage less than or equal to 0 V. The sensing signal terminal Sense is configured to provide a reset signal and obtain a sensing signal, the reset signal is used to reset the anode of the light-emitting device D, and the sensing signal is used to calculate a threshold voltage of the thin film transistor T3.

When the pixel driver circuit 12 operates in a blanking period of an image frame, an operating process of the pixel driver circuit 12 is, for example, as below: the thin film transistor T1 is turned on under control of a first sub-signal of the first gate signal provided by the first gate signal terminal G1 to transmit the detection data signal from the data signal terminal Data to the node G; the thin film transistor T2 is turned on under control of a first sub-signal of the second gate signal provided by the second gate signal terminal G2 to transmit a signal at the node S to the sensing signal terminal Sense through the thin film transistor T2; and when the detection data signal and the power supply voltage signal from the power supply voltage signal terminal ELVDD cause the node G to control the thin film transistor T3 to be turned off, a voltage of the sensing signal of the sensing signal terminal Sense is measured, and a threshold voltage of the thin film transistor T3 may be calculated in accordance with a difference between a voltage of the detection data signal and the voltage of the sensing signal.

Figure 1B:
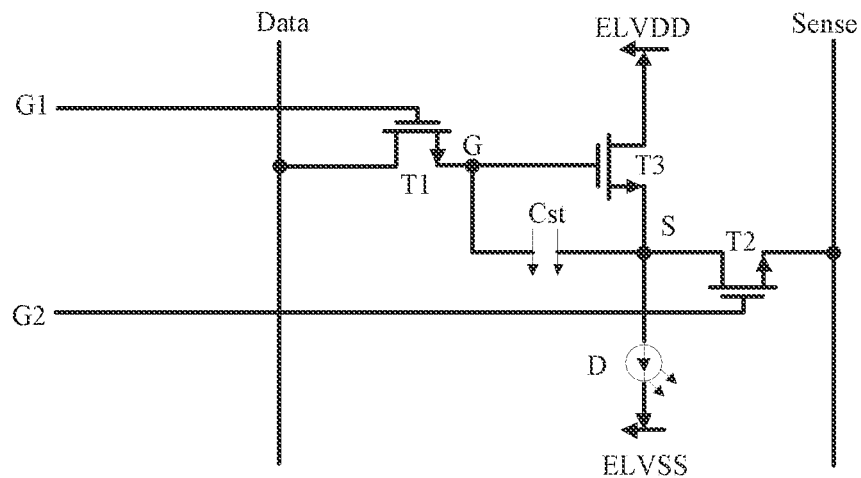
FIG. 1B is a diagram showing a structure of an equivalent circuit of a pixel driver circuit, in accordance with some embodiments of the present disclosure.

In the above process, the sensing signal is measured by controlling a sensing transistor (the thin film transistor T2), and thus the threshold voltage of the driving transistor (the thin film transistor T3) is calculated. After being calculated, the threshold voltage of the driving transistor is further compensated into the display data signal, thereby completing an external compensation for the pixel driver circuit 12. Referring to FIG. 1B, when the external compensation is performed, the pixel driver circuit 12 needs to receive the first sub-signal of the first gate signal and the first sub-signal of the second gate signal to turn on the thin film transistor T1 and the thin film transistor T2, respectively. In this case, the sensing signal terminal Sense is in a floating state, which is equivalent to a capacitor. After the detection data signal controls the thin film transistor T3 to be turned on, the power supply voltage signal from the power supply voltage signal terminal ELVDD will be transmitted to the node S to charge the node S until a voltage at the node S no longer changes. In this case, a difference between a voltage at the node G and the voltage at the node S is equal to the threshold voltage of the thin film transistor T3. The thin film transistor T2 is still in a turn-on state, and the signal at the node S transmitted to the sensing signal terminal Sense through the thin film transistor T2 is the sensing signal. In this case, the voltage of the sensing signal is equal to the voltage at the node S. Therefore, the threshold voltage of the thin film transistor T3 may be obtained by calculating the difference between the voltage of the detection data signal and the voltage of the sensing signal.

When the pixel driver circuit 12 operates in a display period of the image frame, an operating process of the pixel driver circuit 12 includes, for example, a reset phase, a data writing phase, and a light-emitting phase.

In the reset phase, the thin film transistor T2 is turned on under control of a second sub-signal of the second gate signal provided by the second gate signal terminal G2 to transmit the reset signal provided by the sensing signal terminal Sense to the node S, so as to reset the anode of the light-emitting device D.

In the data writing phase, the thin film transistor T1 is turned on under control of a second sub-signal of the first gate signal provided by the first gate signal terminal G1 to transmit the display data signal provided by the data signal terminal Data to the node G, and the storage capacitor Cst is charged.

In the light-emitting phase, the thin film transistor T3 is turned on under control of the node G, and the storage capacitor Cst starts to discharge to the node G, so that the voltage at the node G is maintained for a period of time, thereby ensuring turn-on time of the thin film transistor T3. Upon being turned on, the thin film transistor T3 outputs a driving signal to the light-emitting device D under control of the power supply voltage signal provided by the power supply voltage signal terminal ELVDD and a gate voltage of the thin film transistor T3 (i.e., the voltage at the node G). The driving signal is, for example, a driving current, and the light-emitting device D starts to emit light under control of the driving signal.

In a process in which the pixel driver circuit 12 operates in the image frame, gate signals received by the first gate signal terminal G1 and the second gate signal terminal G2 are both provided by the gate driver circuit.

The gate driver circuit includes $N_0$ ($N_0 \geq 2$) shift registers that are cascaded and a plurality of control signal lines. A shift register is coupled to pixel driver circuits 12 in at least one row of sub-pixels P and at least a part of the plurality of control signal lines. The shift register is used to provide gate signal(s) to the pixel driver circuits 12 under control of control signal lines coupled thereto.

Figure 1C:
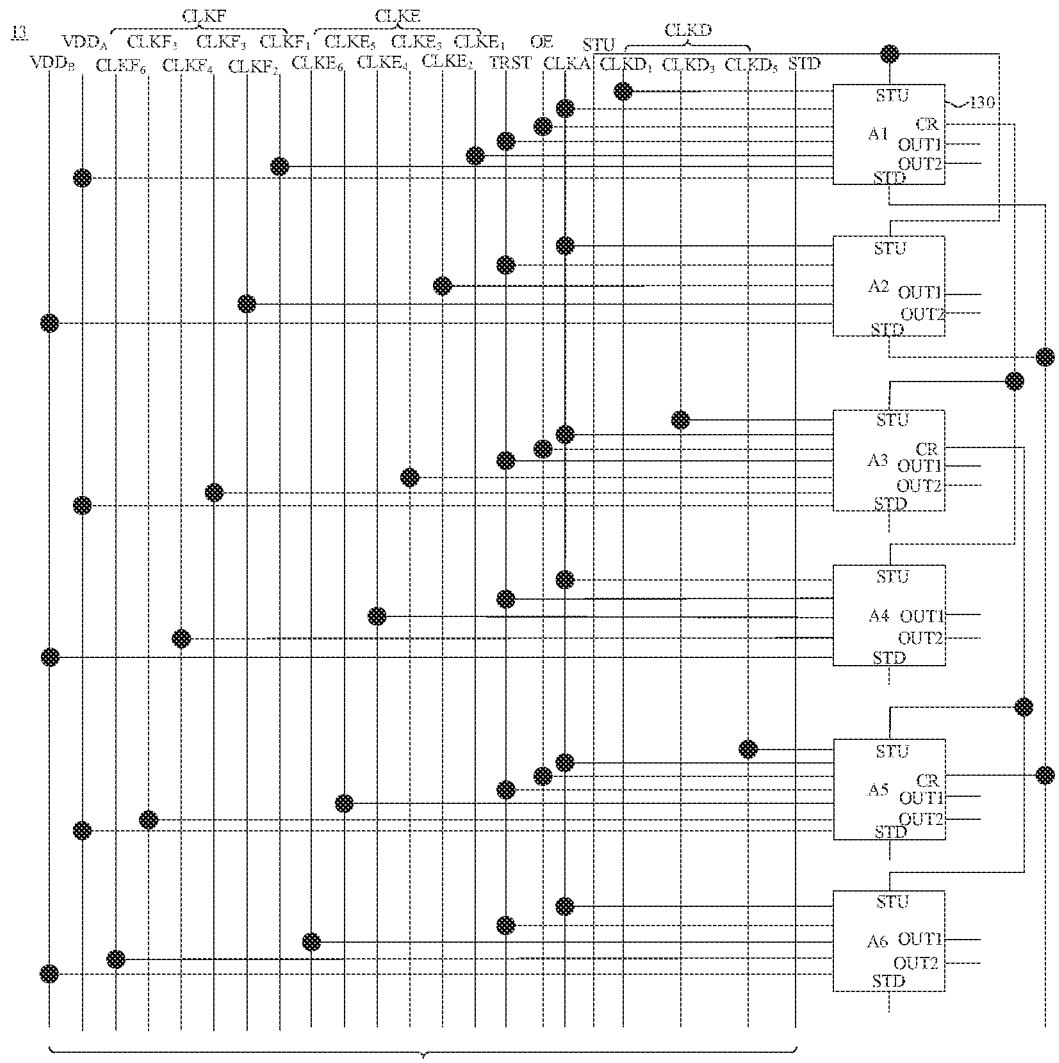
FIG. 1C is a diagram showing a cascade structure of a plurality of shift registers, in accordance with some embodiments of the present disclosure.

For example, referring to FIG. 1C, the gate driver circuit 13 includes $N_0$ shift registers 130 that are cascaded and twenty-two control signal lines 132. It can be understood that FIG. 1C shows only six cascaded shift registers 130. The six shift registers 130 that are cascaded are a first shift register A1, a second shift register A2, a third shift register A3, a fourth shift register A4, a fifth shift register A5, and a sixth shift register A6. Each shift register 130 has an input signal terminal STU, a first output signal terminal OUT1, a second output signal terminal OUT2, and a reset signal terminal STD. The odd-numbered shift registers 130 (i.e., the first shift register A1, the third shift register A3, and the fifth shift register A5) each further include a cascade output signal terminal CR. The input signal terminal STU is configured to receive an input signal. The first output signal terminal OUT1 is configured to output the first gate signal to the first gate signal terminal G1 in the pixel driver circuit 12. The second output signal terminal OUT2 is configured to output the second gate signal to the second gate signal terminal G2 in the pixel driver circuit 12. The first gate signal and the second gate signal may be the same or different. The reset signal terminal STD is configured to receive a reset signal. Except that reset signal terminals STD of the last four shift registers 130 are provided with the reset signal by a reset signal line, the reset signal of an $N_X$th ($N_X$ is less than $N_0$) shift register of remaining shift registers 130 is provided by a cascade output signal terminal CR of an ($N_X$+4)th shift register 130 or an ($N_X$+3)th shift register 130. For example, reset signal terminals STD of the first shift register A1 and the second shift register A2 are coupled to the cascade output signal terminal CR of the fifth shift register A5. The cascade output signal terminal CR of the shift register 130 is further configured to provide the input signal to the input signal terminals STU of a part of the shift registers 130. For example, input signal terminals STU of the third shift register A3 and the fourth shift register A4 are coupled to the cascade output signal terminal CR of the first shift register A1.

The twenty-two control signal lines 132 are an input signal line STU, a global reset signal line TRST, the reset signal line STD, a random signal line OE, a power supply voltage signal line $VDD_A$, a power supply voltage signal line $VDD_B$, a clock signal line CLKA, clock signal lines CLKD (including a clock signal line $CLKD_1$, a clock signal line $CLKD_3$, and a clock signal line $CLKD_5$), clock signal lines CLKE (including a clock signal line $CLKE_1$, a clock signal line $CLKE_2$, a clock signal line $CLKE_3$, a clock signal line $CLKE_4$, a clock signal line $CLKE_5$, and a clock signal line $CLKE_6$), and clock signal lines CLKF (including a clock signal line $CLKF_1$, a clock signal line $CLKF_2$, a clock signal line $CLKF_3$, a clock signal line $CLKF_4$, a clock signal line $CLKF_5$, and a clock signal line $CLKF_6$).

Figure 1D:
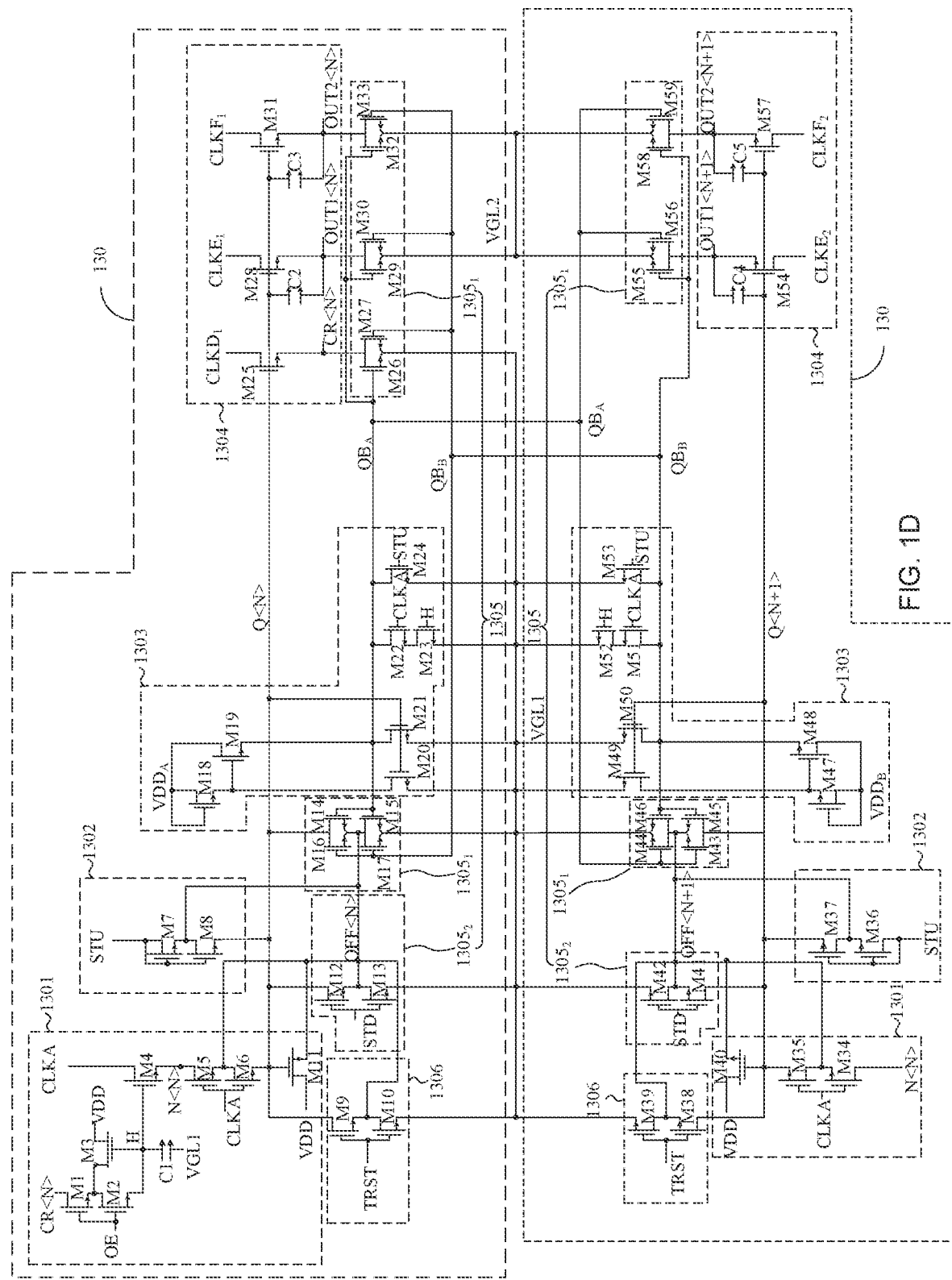
FIG. 1D is a diagram showing a structure of an equivalent circuit of a shift register, in accordance with some embodiments of the present disclosure.

Referring to FIGS. 1C and 1D, the input signal line STU is configured to provide the input signal to the input signal terminals STU of a part of the shift registers 130. For example, the input signal line STU provides the input signal to the input signal terminals STU of the first shift register A1 and the second shift register A2. The input signal terminals STU of the third shift register A3 and the fourth shift register A4 are coupled to the cascade output signal terminal CR of the first shift register A1, and the output signal of the cascade output signal terminal CR of the first shift register A1 is used as the input signal of the third shift register A3 and the fourth shift register A4. The input signal terminals STU of the fifth shift register A5 and the sixth shift register A6 are coupled to the cascade output signal terminal CR of the third shift register A3, and the output signal of the cascade output signal terminal CR of the third shift register A3 is used as the input signal of the fifth shift register A5 and the sixth shift register A6.

Referring to FIGS. 1C and 1D, the global reset signal line TRST is configured to provide a global reset signal to global reset signal terminals TRST of all the shift registers 130. Therefore, each shift register 130 is coupled to the global reset signal line TRST.

Referring to FIGS. 1C and 1D, the reset signal line STD is configured to provide the reset signal to the reset signal terminals STD of a part of the shift registers 130, and the last four shift registers 130 in the gate driver circuit 13 are coupled to the reset signal line STD.

Referring to FIGS. 1C and 1D, the random signal line OE is configured to provide a random signal to random signal terminals OE of a part of the shift registers 130. For example, the random signal line OE provides the random signal to the odd-numbered shift registers 130 (i.e., the first shift register A1, the third shift register A3, and the fifth shift register A5).

Referring to FIGS. 1C and 1D, the power supply voltage signal line $VDD_A$ and the power supply voltage signal line $VDD_B$ are configured to provide a power supply voltage signal to power supply voltage signal terminals $VDD_A$ of a part of the shift registers 130 and a power supply voltage signal to power supply voltage signal terminals $VDD_B$ of the other part of the shift registers 130, respectively. The power supply voltage signal line $VDD_A$ is configured to provide the power supply voltage signal to the odd-numbered shift registers 130 (i.e., the first shift register A1, the third shift register A3, and the fifth shift register A5). The power supply voltage signal line $VDD_B$ is configured to provide the power supply voltage signal to even-numbered shift registers 130 (i.e., the second shift register A2, the fourth shift register A4, and the sixth shift register A6).

Referring to FIGS. 1C and 1D, the clock signal line CLKA is configured to provide a clock signal to clock signal terminals CLKA of the shift registers 130. For example, the clock signal line CLKA provides the clock signal to each shift register 130, so that each shift register 130 needs to be coupled to the clock signal line CLKA.

Referring to FIGS. 1C and 1D, the clock signal lines CLKD are configured to provide clock signals to clock signal terminals CLKD of a part of the shift registers 130. For example, the clock signal lines CLKD provide the clock signals to the odd-numbered shift registers 130 (i.e., the first shift register A1, the third shift register A3, and the fifth shift register A5). For example, the clock signal line $CLKD_1$ provides a clock signal to the first shift register A1, the clock signal line $CLKD_3$ provides a clock signal to the third shift register A3, and the clock signal line $CLKD_5$ provides a clock signal to the fifth shift register A5. The clock signals provided by the clock signal line $CLKD_1$, the clock signal line $CLKD_3$, and the clock signal line $CLKD_5$ may be the same or different, which will not be limited in the embodiments of the present disclosure.

Referring to FIGS. 1C and 1D, the clock signal lines CLKE are configured to provide clock signals to clock signal terminals CLKE of the shift registers 130. For example, the clock signal lines CLKE provide the clock signals to the shift registers 130, so that each shift register 130 needs to be coupled to a clock signal line CLKE. For example, the first shift register A1 is coupled to the clock signal line $CLKE_1$, the second shift register A2 is coupled to the clock signal line $CLKE_2$, the third shift register A3 is coupled to the clock signal line $CLKE_3$, the fourth shift register A4 is coupled to the clock signal line $CLKE_4$, the fifth shift register A5 is coupled to the clock signal line $CLKE_5$, and the sixth shift register A6 is coupled to the clock signal line $CLKE_6$. The clock signals provided by the clock signal line $CLKE_1$, the clock signal line $CLKE_2$, the clock signal line $CLKE_3$, the clock signal line $CLKE_4$, the clock signal line $CLKE_5$, and the clock signal line $CLKE_6$ (i.e., provided by the clock signal lines CLKE) may be the same or different, which will not be limited in the embodiments of the present disclosure.

Referring to FIGS. 1C and 1D, the clock signal lines CLKF are configured to provide clock signals to clock signal terminals CLKF of the shift registers 130. For example, the clock signal lines CLKF provide the clock signals to the shift register 130, so that each shift register 130 needs to be coupled to a clock signal line CLKF. For example, the first shift register A1 is coupled to the clock signal line $CLKF_1$, the second shift register A2 is coupled to the clock signal line $CLKF_2$, the third shift register A3 is coupled to the clock signal line $CLKF_3$, the fourth shift register A4 is coupled to the clock signal line $CLKF_4$, the fifth shift register A5 is coupled to the clock signal line $CLKF_5$, and the sixth shift register A6 is coupled to the clock signal line $CLKF_6$. The clock signals provided by the clock signal line $CLKF_1$, the clock signal line $CLKF_2$, the clock signal line $CLKF_3$, the clock signal line $CLKF_4$, the clock signal line $CLKF_5$, and the clock signal line $CLKF_6$ (i.e., provided by the clock signal lines CLKF) may be the same or different, which will not be limited in the embodiments of the present disclosure.

In some embodiments, the clock signals provided by the clock signal lines CLKE and the clock signals provided by the clock signal lines CLKF are the same. That is, the clock signal provided by the clock signal line $CLKE_1$ is the same as the clock signal provided by the clock signal line $CLKF_1$, the clock signal provided by the clock signal line $CLKE_2$ is the same as the clock signal provided by the clock signal line $CLKF_2$, the clock signal provided by the clock signal line $CLKE_3$ is the same as the clock signal provided by the clock signal line $CLKF_3$, the clock signal provided by the clock signal line $CLKE_4$ is the same as the clock signal provided by the clock signal line $CLKF_4$, the clock signal provided by the clock signal line $CLKE_5$ is the same as the clock signal provided by the clock signal line $CLKF_5$, and the clock signal provided by the clock signal line $CLKE_6$ is the same as the clock signal provided by the clock signal line $CLKF_6$.

Based on a cascade structure diagram of the shift registers 130 shown in FIG. 1C, referring to FIG. 1D, the embodiments of the present disclosure provides a shift register 130. The shift register 130 includes a blanking input sub-circuit 1301, a display input sub-circuit 1302, a control sub-circuit 1303, an output sub-circuit 1304, a reset sub-circuit 1305, and a global reset sub-circuit 1306.

For example, for an Nth shift register 130, the blanking input sub-circuit 1301 is configured to, during the blanking period of the image frame, control the gate driver circuit 13 to output a blanking control signal to the pixel driver circuit 12. For example, the first sub-signal of the first gate signal is output to the first gate signal terminal G1, the first sub-signal of the second gate signal is output to the second gate signal terminal G2. The thin film transistor T1 is turned on under the control of the first sub-signal of the first gate signal, the thin film transistor T2 is turned on under the control of the first sub-signal of the second gate signal, and the signal at the node S may be transmitted to the sensing signal terminal Sense. The voltage of the sensing signal may be obtained by measuring a voltage of the signal from the sensing signal terminal Sense. During the blanking period, the pixel driver circuit 12 does not drive the light-emitting device D to emit light, but obtains the threshold voltage of the thin film transistor T3. The process of obtaining the threshold voltage of the thin film transistor T3 has been described above, which will not be repeated herein.

Referring to FIG. 1D, the blanking input sub-circuit 1301 includes, for example, a first transistor M1, a second transistor M2, a third transistor M3, a fourth transistor M4, a fifth transistor M5, a sixth transistor M6, an eleventh transistor M11, and a first capacitor C1.

A gate of the first transistor M1 is coupled to a random signal terminal OE, a first electrode of the first transistor M1 is coupled to a cascade output signal terminal CR<N> of the Nth shift register 130, and a second electrode of the first transistor M1 is coupled to a first electrode of the second transistor M2. A gate of the second transistor M2 is coupled to the random signal terminal OE, the first electrode of the second transistor M2 is further coupled to a second electrode of the third transistor M3, and a second electrode of the second transistor M2 is coupled to a node H. A plate of the third transistor M3 is coupled to the node H, a first electrode of the third transistor M3 is coupled to a power supply voltage signal terminal VDD, and the second electrode of the third transistor M3 is further coupled to the second electrode of the first transistor M1. A gate of the fourth transistor M4 is coupled to the node H, a first electrode of the fourth transistor M4 is coupled to a clock signal terminal CLKA, and a second electrode of the fourth transistor M4 is coupled to a node N<N> of the Nth shift register 130. A gate of the fifth transistor M5 is coupled to the clock signal terminal CLKA, a first electrode of the fifth transistor M5 is coupled to the node N<N>, and a second electrode of the fifth transistor M5 is coupled to a first electrode of the sixth transistor M6. A gate of the sixth transistor M6 is coupled to the clock signal terminal CLKA, the first electrode of the sixth transistor M6 is further coupled to a leakage prevention node OFF<N> of the Nth shift register 130, and a second electrode of the sixth transistor M6 is coupled to a pull-up node Q<N> of the Nth shift register 130. A gate of the eleventh transistor M11 is coupled to the pull-up node Q<N>, a first electrode of the eleventh transistor M11 is coupled to the power supply voltage signal terminal VDD, and a second electrode of the eleventh transistor M11 is coupled to the leakage prevention node OFF<N>. One end of the first capacitor C1 is coupled to the node H, and another end of the first capacitor C1 is coupled to a first voltage signal terminal VGL1.

The display input sub-circuit 1302 is configured to, during the display period of the image frame, control the gate driver circuit 13 to output a display control signal to the pixel driver circuit 12. For example, the second sub-signal of the first gate signal is output to the first gate signal terminal G1, the second sub-signal of the second gate signal is output to the second gate signal terminal G2. The thin film transistor T1 is turned on under the control of the second sub-signal of the first gate signal, the thin film transistor T2 is turned on under the control of the second sub-signal of the second gate signal, and the reset signal provided by the sensing signal terminal Sense is transmitted to the node S through the thin film transistor T2. During the display period, the pixel driver circuit 12 will drive the light-emitting device D to emit light, and the process in which the pixel driver circuit 12 drives the light-emitting device D to emit light has been described above, which will not be repeated.

Referring to FIG. 1D, the display input sub-circuit 1302 includes, for example, a seventh transistor M7 and an eighth transistor M8.

A gate and a first electrode of the seventh transistor M7 are both coupled to the input signal terminal STU, and a second electrode of the seventh transistor M7 is coupled to a first electrode of the eighth transistor M8 and the leakage prevention node OFF<N>. A gate of the eighth transistor M8 is coupled to the input signal terminal STU, and a second electrode of the eighth transistor M8 is coupled to the pull-up node Q<N>. During the display period, the seventh transistor M7 and the eighth transistor M8 are turned on under control of the input signal (e.g., a high-level input signal) provided by the input signal terminal STU to transmit the high-level input signal to the pull-up node Q<N> and the leakage prevention node OFF<N>, so as to pull up voltages of the pull-up node Q<N> and the leakage prevention node OFF<N>.

The control sub-circuit 1303 is configured to control potential balance between the pull-up node Q<N> and a first pull-down node $QB_A$. For example, when a voltage of the pull-up node Q<N> is at a high level, the control sub-circuit 1303 controls a voltage of the first pull-down node $QB_A$ to be at a low level; and when the voltage of the first pull-down node $QB_A$ is at a high level, the control sub-circuit 1303 controls the voltage of the pull-up node Q<N> to be at a low level.

Referring to FIG. 1D, the control sub-circuit 1303 includes, for example, an eighteenth transistor M18, a nineteenth transistor M19, a twentieth transistor M20, a twenty-first transistor M21, a twenty-second transistor M22, a twenty-third transistor M23, and a twenty-fourth transistor M24.

A gate and a first electrode of the eighteenth transistor M18 are coupled to a power supply voltage signal terminal $VDD_A$, and a second electrode of the eighteenth transistor M18 is coupled to a gate of the nineteenth transistor M19. A first electrode of the nineteenth transistor M19 is coupled to the power supply voltage signal terminal $VDD_A$, and a second electrode of the nineteenth transistor M19 is coupled to the first pull-down node $QB_A$. A gate of the twentieth transistor M20 is coupled to the pull-up node Q<N>, a first electrode of the twentieth transistor M20 is coupled to the gate of the nineteenth transistor M19, and a second electrode of the twentieth transistor M20 is coupled to the first voltage signal terminal VGL1. A gate of the twenty-first transistor M21 is coupled to the pull-up node Q<N>, a first electrode of the twenty-first transistor M21 is coupled to the first voltage signal terminal VGL1, and a second electrode of the twenty-first transistor M21 is coupled to the first pull-down node $QB_A$. A gate of the twenty-second transistor M22 is coupled to the clock signal terminal CLKA, a first electrode of the twenty-second transistor M22 is coupled to the first pull-down node $QB_A$, and a second electrode of the twenty-second transistor M22 is coupled to a second electrode of the twenty-third transistor M23. A gate of the twenty-third transistor M23 is coupled to the node H, and a first electrode of the twenty-third transistor M23 is coupled to the first voltage signal terminal VGL1. A gate of the twenty-fourth transistor M24 is coupled to the input signal terminal STU, a first electrode of the twenty-fourth transistor M24 is coupled to the first voltage signal terminal VGL1, and a second electrode of the twenty-fourth transistor M24 is coupled to the first pull-down node $QB_A$. The eighteenth transistor M18 is turned on under control of the power supply voltage signal provided by the power supply voltage signal terminal $VDD_A$ to transmit the power supply voltage signal (e.g., a high-level power supply voltage signal) provided by the power supply voltage signal terminal $VDD_A$ to the gate of the nineteenth transistor M19, thereby controlling the nineteenth transistor M19 to be turned on. After the nineteenth transistor M19 is turned on, the high-level power supply voltage signal provided by the power supply voltage signal terminal $VDD_A$ may be transmitted to the first pull-down node $QB_A$ to charge the first pull-down node $QB_A$. When the voltage of the pull-up node Q<N> is at a high level, the twentieth transistor M20 and the twenty-first transistor M21 are turned on. The twentieth transistor M20 transmits a low-level first voltage signal provided by the first voltage signal terminal VGL1 to the gate of the nineteenth transistor M19, so that the nineteenth transistor M19 is turned off. When the twenty-first transistor M21 is turned on, it may transmit the low-level first voltage signal to the first pull-down node $QB_A$, so as to discharge the first pull-down node $QB_A$. The twenty-fourth transistor M24 is turned on under control of the high-level input signal provided by the input signal terminal STU to transmit the low-level first voltage signal to the first pull-down node $QB_A$, so as to discharge the first pull-down node $QB_A$. When a level of the node H is a high level, the twenty-third transistor M23 is turned on to transmit the low-level first voltage signal provided by the first voltage signal terminal VGL1 to the second electrode of the twenty-second transistor M22. When the clock signal provided by the clock signal terminal CLKA is also at a high level, the twenty-second transistor M22 is turned on to transmit the low-level first voltage signal to the first pull-down node $QB_A$, so as to pull down the voltage of the first pull-down node $QB_A$. During the display period, when the input signal is at the high-level, the seventh transistor M7 and the eighth transistor M8 are turned on to charge the pull-up node Q<N>. When the voltage of the pull-up node Q<N> is at a high level; the voltage of the first pull-down node $QB_A$ is at a low level. Therefore, a voltage relationship between the pull-up node Q<N> and the first pull-down node $QB_A$ may be controlled through the twenty-fourth transistor M24. During the blanking period, when the clock signal provided by the clock signal terminal CLKA and a voltage of the node H are at high levels, the voltage of the pull-up node Q<N> is at the high level. Therefore; the voltage relationship between the pull-up node Q<N> and the first pull-down node $QB_A$ may be controlled through the twenty-second transistor M22 and the twenty-third transistor M23. When the voltage of the pull-up node Q<N> is at the high level, the twentieth transistor M20 is turned on to make the nineteenth transistor M19 to be turned off, thereby causing the power supply voltage signal terminal $VDD_A$ to stop charging the first pull-down node $QB_A$. Meanwhile, the twenty-first transistor M21 is turned on to transmit the low-level first voltage signal to the first pull-down node $QB_A$, so as to pull down the voltage of the first pull-down node $QB_A$. Therefore, the control sub-circuit 1303 realizes a control of the voltages of the pull-up node Q<N> and the first pull-down node $QB_A$.

The output sub-circuit 1304 is configured to output the first sub-signal of the first gate signal and the first sub-signal of the second gate signal during the blanking period of the image frame, and to output the second sub-signal of the first gate signal and the second sub-signal of the second gate signal during the display period of the image frame.

Referring to FIG. 1D, the output sub-circuit 1304 includes, for example, a twenty-fifth transistor M25, a twenty-eighth transistor M28, a thirty-first transistor M31, a second capacitor C2, and a third capacitor C3.

A gate of the twenty-fifth transistor M25 is coupled to the pull-up node Q<N>, a first electrode of the twenty-fifth transistor M25 is coupled to a clock signal terminal $CLKD_1$, and a second electrode of the twenty-fifth transistor M25 is coupled to the cascade output signal terminal CR<N>. A gate of the twenty-eighth transistor M28 is coupled to the pull-up node Q<N>, a first electrode of the twenty-eighth transistor M28 is coupled to a clock signal terminal $CLKE_1$, and a second electrode of the twenty-eighth transistor M28 is coupled to a first output signal terminal OUT1<N> of the Nth shift register 130. A gate of the thirty-first transistor M31 is coupled to the pull-up node Q<N>, a first electrode of the thirty-first transistor M31 is coupled to a clock signal terminal $CLKF_1$, and a second electrode of the thirty-first transistor M31 is coupled to a second output signal terminal OUT2<N> of the Nth shift register 130. One end of the second capacitor C2 is coupled to the gate of the twenty-eighth transistor M28, and another end of the second capacitor C2 is coupled to the first output signal terminal OUT1<N>. One end of the third capacitor C3 is coupled to the gate of the thirty-first transistor M31, and another end of the third capacitor C3 is coupled to the second output signal terminal OUT2<N>. When the voltage of the pull-up node Q<N> is at the high level, the twenty-fifth transistor M25, the twenty-eighth transistor M28, and the thirty-first transistor M31 are turned on. The twenty-fifth transistor M25 transmits the clock signal provided by the clock signal terminal $CLKD_1$ to the cascade output signal terminal CR<N>. The twenty-eighth transistor M28 transmits the clock signal provided by the clock signal terminal $CLKE_1$ to the first output signal terminal OUT1<N>, and a signal output from the first output signal terminal OUT1<N> is the first gate signal. The thirty-first transistor M31 transmits the clock signal provided by the clock signal terminal $CLKF_1$ to the second output signal terminal OUT2<N>, and a signal output from the second output signal terminal OUT2<N> is the second gate signal. The second capacitor C2 is used to maintain a voltage of the gate of the twenty-eighth transistor M28, so that the twenty-eighth transistor M28 may be maintained in an turn-on state and output the clock signal provided by the clock signal terminal $CLKE_1$; and the third capacitor C3 is used to maintain a voltage of the gate of the thirty-first transistor M31, so that the thirty-first transistor M31 may be maintained in an turn-on state and output the clock signal provided by the clock signal terminal $CLKF_1$. A cascade signal output by the cascade output signal terminal CR<N> is, for example, received by the first electrode of the first transistor M1, so as to be used as an input signal of the blanking input sub-circuit 1301.

Referring to FIG. 1D, the output sub-circuit 1304 is coupled to a first output signal terminal OUT1<N> and a second output signal terminal OUT2<N>. Referring to FIG. 1B, the first output signal terminal OUT1<N> is configured to provide the first gate signal to the first gate signal terminal G1, and the second output signal terminal OUT2<N> is configured to provide the second gate signal to the second gate signal terminal G2. The first gate signal and the second gate signal may be the same or different on a premise that the pixel driver circuit 12 is ensured to operate normally, which will not be limited in the embodiments of the present disclosure.

The reset sub-circuit 1305 is configured to reset the pull-up node Q<N>, the leakage prevention node OFF<N>, and the output sub-circuit 1304. The reset sub-circuit 1305 includes, for example, a first reset sub-circuit $1305_1$ and a second reset sub-circuit $1305_2$. The first reset sub-circuit $1305_1$ is configured to reset the pull-up node Q<N>, the leakage prevention node OFF<N>, and the output sub-circuit 1304, and the second reset sub-circuit $1305_2$ is configured to reset the pull-up node Q<N> and the leakage prevention node OFF<N>.

Referring to FIG. 1D, the first reset sub-circuit $1305_1$ includes, for example, a fourteenth transistor M14, a fifteenth transistor M15, a sixteenth transistor M16, a seventeenth transistor M17, a twenty-sixth transistor M26, a twenty-seventh transistor M27, a twenty-ninth transistor M29, a thirtieth transistor M30, a thirty-second transistor M32, and a thirty-third transistor M33. A gate of the fourteenth transistor M14 is coupled to the first pull-down node $QB_A$, a first electrode of the fourteenth transistor M14 is coupled to the leakage prevention node OFF<N>, and a second electrode of the fourteenth transistor M14 is coupled to the pull-up node Q<N>. A gate of the fifteenth transistor M15 is coupled to the first pull-down node $QB_A$, a first electrode of the fifteenth transistor M15 is coupled to the first voltage signal terminal VGL1, and a second electrode of the fifteenth transistor M15 is coupled to the leakage prevention node OFF<N>. A gate of the sixteenth transistor M16 is coupled to a second pull-down node $QB_B$, a first electrode of the sixteenth transistor M16 is coupled to the leakage prevention node OFF<N>, and a second electrode of the sixteenth transistor M16 is coupled to the pull-up node Q<N>. A gate of the seventeenth transistor M17 is coupled to the second pull-down node $QB_B$, a first electrode of the seventeenth transistor M17 is coupled to the first voltage signal terminal VGL1, and a second electrode of the seventeenth transistor M17 is coupled to the leakage prevention node OFF<N>. A gate of the twenty-sixth transistor M26 is coupled to the first pull-down node $QB_A$, a first electrode of the twenty-sixth transistor M26 is coupled to the first voltage signal terminal VGL1, and a second electrode of the twenty-sixth transistor M26 is coupled to the cascade output signal terminal CR<N>. A gate of the twenty-seventh transistor M27 is coupled to the second pull-down node $QB_B$, a first electrode of the twenty-seventh transistor M27 is coupled to the first voltage signal terminal VGL1, and a second electrode of the twenty-seventh transistor M27 is coupled to the cascade output signal terminal CR<N>. A gate of the twenty-ninth transistor M29 is coupled to the first pull-down node $QB_A$, a first electrode of the twenty-ninth transistor M29 is coupled to a second voltage signal terminal VGL2, and a second electrode of the twenty-ninth transistor M29 is coupled to the first output signal terminal OUT1<N>. A gate of the thirtieth transistor M30 is coupled to the second pull-down node $QB_B$, a first electrode of the thirtieth transistor M30 is coupled to the second voltage signal terminal VGL2, and a second electrode of the thirtieth transistor M30 is coupled to the first output signal terminal OUT1<N>. A gate of the thirty-second transistor M32 is coupled to the first pull-down node $QB_A$, a first electrode of the thirty-second transistor M32 is coupled to the second voltage signal terminal VGL2, and a second electrode of the thirty-second transistor M32 is coupled to the second output signal terminal OUT2<N>. A gate of the thirty-third transistor M33 is coupled to the second pull-down node $QB_B$, a first electrode of the thirty-third transistor M33 is coupled to the second voltage signal terminal VGL2, and a second electrode of the thirty-third transistor M33 is coupled to the second output signal terminal OUT2<N>. When the voltage of the first pull-down node $QB_A$ is at a high level, the fourteenth transistor M14, the fifteenth transistor M15, the twenty-sixth transistor M26, the twenty-ninth transistor M29, and the thirty-second transistor M32 are all turned on. The fifteenth transistor M15 transmits the first voltage signal provided by the first voltage signal terminal VGL1 to the leakage prevention node OFF<N> to reset the leakage prevention node OFF<N>. The first voltage signal is a low-level signal. In this case, a voltage of the leakage prevention node OFF<N> is at a low level. When the fourteenth transistor M14 is turned on, the low-level signal may be transmitted to the pull-up node Q<N> to reset the pull-up node Q<N>. When the twenty-sixth transistor M26 is turned on, the first voltage signal provided by the first voltage signal terminal VGL1 may be transmitted to the cascade output signal terminal CR<N> to reset the cascade output signal terminal CR<N>. When the twenty-ninth transistor M29 is turned on, the second voltage signal provided by the second voltage signal terminal VGL2 may be transmitted to the first output signal terminal OUT1<N> to reset the first output signal terminal OUT1<N>. When the thirty-second transistor M32 is turned on, the second voltage signal provided by the second voltage signal terminal VGL2 may be transmitted to the second output signal terminal OUT2<N> to reset the second output signal terminal OUT2<N>. When a voltage of the second pull-down node $QB_B$ is at a high level, the sixteenth transistor M16, the seventeenth transistor M17, the twenty-seventh transistor M27, the thirtieth transistor M30, and the thirty-third transistor M33 are turned on. The sixteenth transistor M16 plays the same role as the fourteenth transistor M14, the seventeenth transistor M17 plays the same role as the fifteenth transistor M15, the twenty-seventh transistor M27 plays the same role as the twenty-sixth transistor M26, the thirtieth transistor M30 plays the same role as the twenty-ninth transistor M29, and the thirty-third transistor M33 plays the same role as the thirty-second transistor M32. Therefore, operations of the sixteenth transistor M16, the seventeenth transistor M17, the twenty-seventh transistor M27, the thirtieth transistor M30, and the thirty-third transistor M33 may be understood with reference to the above descriptions of the fourteenth transistor M14, the fifteenth transistor M15, the twenty-sixth transistor M26, the twenty-ninth transistor M29, and the thirty-second transistor M32.

Referring to FIG. 1D, the second reset sub-circuit $1305_2$ includes, for example, a twelfth transistor M12 and a thirteenth transistor M13. A gate of the twelfth transistor M12 is coupled to the reset signal terminal STD, a first electrode of the twelfth transistor M12 is coupled to the leakage prevention node OFF<N>, and a second electrode of the twelfth transistor M12 is coupled to the pull-up node Q<N>. A gate of the thirteenth transistor M13 is coupled to the reset signal terminal STD, a first electrode of the thirteenth transistor M13 is coupled to the first voltage signal terminal VGL1, and a second electrode of the thirteenth transistor M13 is coupled to the leakage prevention node OFF<N>. When the reset signal provided by the reset signal terminal STD is at a high level, the twelfth transistor M12 and the thirteenth transistor M13 are turned on. After the thirteenth transistor M13 is turned on, the first voltage signal provided by the first voltage signal terminal VGL1 may be transmitted to the leakage prevention node OFF<N> to reset the leakage prevention node OFF<N>. After the twelfth transistor M12 is turned on, the first voltage signal at the leakage prevention node OFF<N> may be transmitted to the pull-up node Q<N> to reset the pull-up node Q<N>. It may also be understood that, the first voltage signal may be transmitted to the pull-up node Q<N> through the thirteenth transistor M13 and the twelfth transistor M12.

The global reset sub-circuit 1306 is configured to reset the pull-up node Q<N> and the leakage prevention node OFF<N> again.

Referring to FIG. 1D, the global reset sub-circuit 1306 includes, for example, a ninth transistor M9 and a tenth transistor M10. A gate of the ninth transistor M9 is coupled to a global reset signal terminal TRST, a first electrode of the ninth transistor M9 is coupled to a second electrode of the tenth transistor M10, and a second electrode of the ninth transistor M9 is coupled to the pull-up node Q<N>. A gate of the tenth transistor M10 is coupled to the global reset signal terminal TRST, a first electrode of the tenth transistor M10 is coupled to the first voltage signal terminal VGL1, and the second electrode of the tenth transistor M10 is further coupled to the leakage prevention node OFF<N>. When the global reset signal provided by the global reset signal terminal TRST is at a high level, the ninth transistor M9 and the tenth transistor M10 are turned on. The tenth transistor M10 transmits the first voltage signal provided by the first voltage signal terminal VGL1 to the leakage prevention node OFF<N> and the first electrode of the ninth transistor M9, so as to reset the leakage prevention node OFF<N>. Meanwhile, the ninth transistor M9 may transmit the first voltage signal to the pull-up node Q<N> to reset the pull-up node Q<N>.

The foregoing is a description of the structure of the Nth shift register 130. Referring to FIG. 1D, a structure of an (N+1)th shift register is similar to the structure of the Nth shift register. The Nth shift register and the (N+1)th shift register share part of transistors. For example, referring to FIG. 1D, the (N+1)th shift register 130 includes: a blanking input sub-circuit 1301 composed of a thirty-fourth transistor M34, a thirty-fifth transistor M35 and a fortieth transistor M40; a display input sub-circuit 1302 composed of a thirty-sixth transistor M36 and a thirty-seventh transistor M37; a control sub-circuit 1303 composed of a forty-seventh transistor M47, a forty-eighth transistor M48, a forty-ninth transistor M49, a fiftieth transistor M50, a fifty-first transistor M51, a fifty-second transistor M52 and a fifty-third transistor M53; an output sub-circuit 1304 composed of a fifty-fourth transistor M54, a fifty-seventh transistor M57, a fourth capacitor C4 and a fifth capacitor C5; a first reset sub-circuit $1305_1$, which is composed of a forty-third transistor M43, a forty-fourth transistor M44, a forty-fifth transistor M45, a forty-sixth transistor M46, a fifty-fifth transistor M55, a fifty-sixth transistor M56, a fifty-eighth transistor M58 and a fifty-ninth transistor M59, in a reset sub-circuit 1305; a second reset sub-circuit 1305₂, which is composed of a forty-first transistor M41 and a forty-second transistor M42; and a global reset sub-circuit 1306 composed of a thirty-eighth transistor M38 and a thirty-ninth transistor M39, in the reset sub-circuit 1305.

The blanking input sub-circuit 1301 in the (N+1)th shift register and the blanking input sub-circuit 1301 in the Nth shift register share the first transistor M1, the second transistor M2, the third transistor M3, the fourth transistor M4, and the first capacitor C1, so that the number of transistors in the (N+1)th shift register may be reduced.

The first pull-down node $QB_A$ in the Nth shift register is coupled to a first pull-down node $QB_A$ in the (N+1)th shift register, and the second pull-down node $QB_B$ in the Nth shift register is coupled to a second pull-down node $QB_B$ in the (N+1)th shift register. The first pull-down node $QB_A$ and the second pull-down node $QB_B$ in the Nth shift register are coupled to external voltage signal terminals, and the external voltage signal terminals may make the voltages of the first pull-down node $QB_A$ and the second pull-down node $QB_B$ jump to high voltages. Moreover, the first pull-down node $QB_A$ in the Nth shift register is coupled to the first pull-down node $QB_A$ in the (N+1)th shift register, and the second pull-down node $QB_B$ in the Nth shift register is coupled to the second pull-down node $QB_B$ in the (N+1)th shift register, which may reduce the number of transistors and reduce operating pressures of the transistors. In addition, the first pull-down node $QB_A$ and the second pull-down node $QB_B$ are provided in each shift register, so that the first pull-down node $QB_A$ and the second pull-down node $QB_B$ may operate alternately, thereby reducing the operating pressures of the transistors.

Figure 1E:
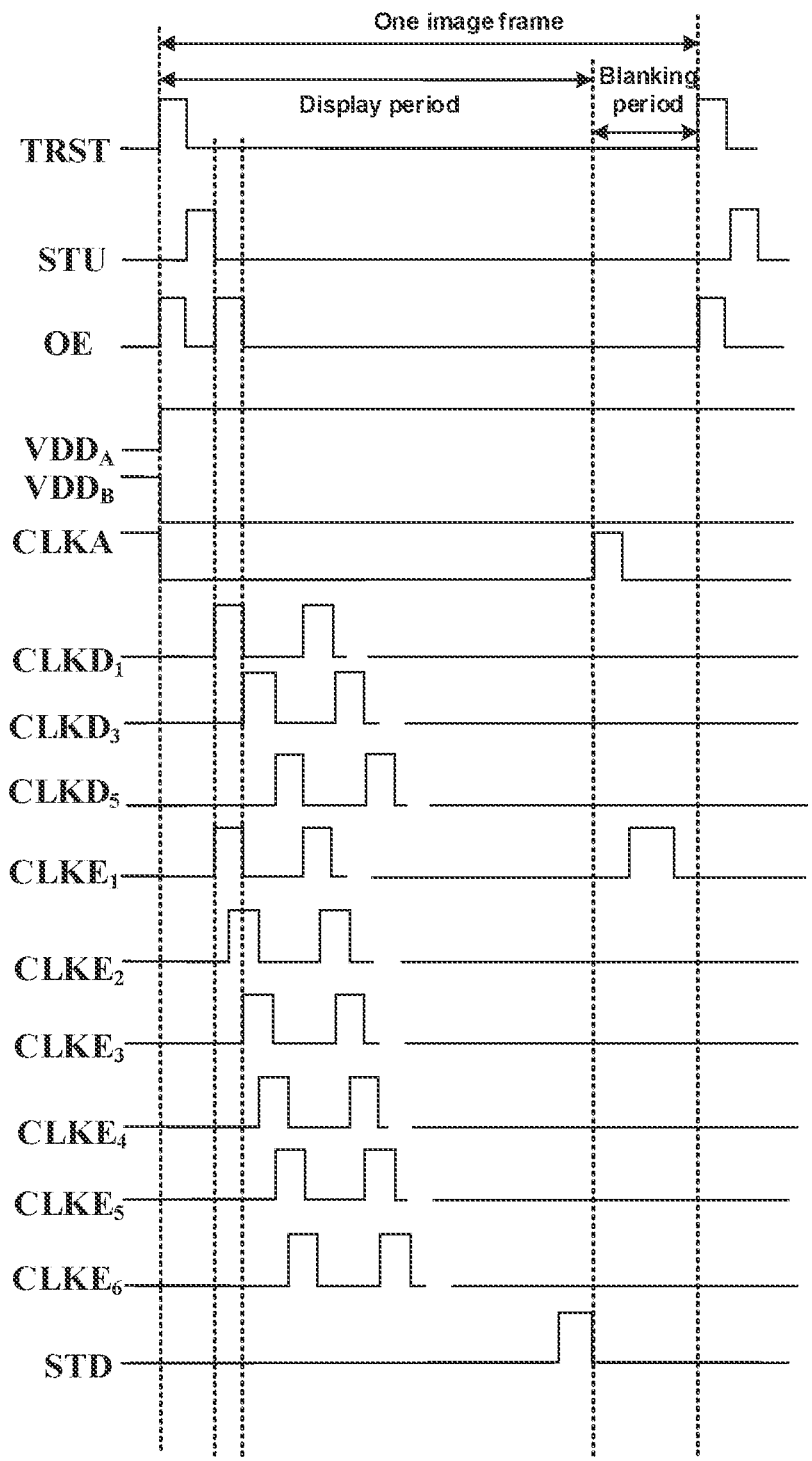
FIG. 1E is a timing diagram corresponding to the shift register in FIG. 1D, in accordance with some embodiments of the present disclosure.

Referring to FIGS. 1D and 1E, in the image frame, the display period precedes the blanking period. That is, the shift register 130 first outputs the second sub-signal of the first gate signal and the second sub-signal of the second gate signal to the pixel driver circuit 12, and then outputs the first sub-signal of the first gate signal and the first sub-signal of the second gate signal to the pixel driver circuit 12.

Referring to FIG. 1E, for the Nth shift register 130, during the display period, the global reset signal provided by the global reset signal terminal TRST is at a high level, the global reset sub-circuit 1306 starts to operate, and the ninth transistor M9 and the tenth transistor M10 are turned on to reset the pull-up node Q<N> and the leakage prevention node OFF<N>; the random signal OE provided by the random signal terminal OE is at a high level, and the first transistor M1 and the second transistor M2 are turned on. In this case, the cascade output signal terminal CR<N> has no output signal, and therefore, the voltage of the node H is at a low level. The power supply voltage signal $VDD_A$ provided by the power supply voltage signal terminal $VDD_A$ is at a high level, and the eighteenth transistor M18 and the nineteenth transistor M19 in the control sub-circuit 1303 are turned on to charge the first pull-down node $QB_A$, so that a voltage of the first pull-down node $QB_A$ is at a high level. Then, the input signal STU provided by the input signal terminal STU is at a high level, the twenty-fourth transistor M24 is turned on to transmit the first voltage signal to the first pull-down node $QB_A$, so that the voltage of the first pull-down node $QB_A$ becomes at a low level. When the input signal STU is at the high level, the display input sub-circuit 1302 starts to operate, and the seventh transistor M7 and the eighth transistor M8 are turned on to charge the pull-up node Q<N> and the leakage prevention node OFF<N>, so that voltages of the pull-up node Q<N> and the leakage prevention node OFF<N> are at high levels. When the voltage of the pull-up node Q<N> is at a high level, the twentieth transistor M20 and the twenty-first transistor M21 are turned on, so that the nineteenth transistor M19 is turned off and the voltage of the first pull-down node $QB_A$ continues to maintain at the low level. When the voltage of the pull-up node Q<N> is at the high level; the twenty-fifth transistor M25, the twenty-eighth transistor M28, and the thirty-first transistor M31 are turned on, and the cascade output signal terminal CR<N>, the first output signal terminal OUT<N>, and the second output signal terminal OUT2<N> start to output signals. A signal output by the cascade output signal terminal CR<N> is, for example, used as the input signal STU of the (N+2)th or (N+3)th shift register 130; a first output signal output by the first output signal terminal OUT1<N> is, for example, used as the second sub-signal of the first gate signal; and a second output signal output by the second output signal terminal OUT2<N> is, for example, used as the second sub-signal of the second gate signal. When the voltage of the pull-up node Q<N> is at the high level; the eleventh transistor M11 is turned on to transmit the power supply voltage signal provided by the power supply voltage signal terminal VDD to the leakage prevention node OFF<N>, and thus the voltage of the leakage prevention node OFF<N> is at a high level. In this case, for the sixth transistor M6, its first electrode is coupled to the leakage prevention node OFF<N>, so that the first electrode of the sixth transistor M6 is at a high level, and the second electrode of the sixth transistor M6 is coupled to the pull-up node Q<N>, so that the second electrode of the sixth transistor M6 is also at a high level. Therefore, it is possible to prevent charges at the pull-up node Q<N> from leaking through the sixth transistor M6, and an effect of leakage prevention may be realized. When the clock signal $CLKD_1$ provided by the clock signal terminal $CLKD_1$ is at a high level, and the random signal OE is also at a high level, the blanking input sub-circuit 1301 charges the node H through the first transistor M1 and the second transistor M2, and the high level of the node H may be maintained for a period of time due to the first capacitor C1. When the voltage of the node H is at the high level, the fourth transistor M4 and the twenty-third transistor M23 are turned on. Since the clock signal CLKA provided by the clock signal terminal CLKA during the entire display period is at a low level, a voltage of the node N<N> coupled to the second electrode of the fourth transistor M4 is always at a low level during the display period, and the fifth transistor M5 and the sixth transistor M6 are always in an off state during the display period. Finally, when the reset signal STD provided by the reset signal terminal STD is at a high level, the twelfth transistor M12 and the thirteenth transistor M13 are turned on to reset the pull-up node Q<N> and the leakage prevention node OFF<N>, so that voltages of the pull-up node Q<N> and the leakage prevention node OFF<N> are at low levels. When a voltage of the pull-up node Q<N> becomes at a low level, the cascade output signal terminal CR<N>, the first output signal terminal OUT1<N>, and the second output signal terminal OUT2<N> stop outputting signals. Since the power supply voltage signal $VDD_A$ is at the high level, a voltage of the first pull-down node $QB_A$ changes to be at the high level. When the voltage of the first pull-down node $QB_A$ is at the high level, the fourteenth transistor M14, the fifteenth transistor M15, the twenty-sixth transistor M26, the twenty-ninth transistor M29, and the thirty-second transistor M32 are turned on. The fourteenth transistor M14 and the fifteenth transistor M15 may transmit the first voltage signal to the pull-up node Q<N> and the leakage prevention node OFF<N> to reset the pull-up node Q<N> and the leakage prevention node OFF<N>. The twenty-sixth transistor M26 may transmit the first voltage signal to the cascade output signal terminal CR<N> to reset the cascade output signal terminal CR<N>. The twenty-ninth transistor M29 and the thirty-second transistor M32 each may transmit a low-level second voltage signal provided by the second voltage signal terminal VGL2 to the first output signal terminal OUT1<N> and the second output signal terminal OUT2<N> to reset the first output signal terminal OUT1<N> and the second output signal terminal OUT2<N>. The display period ends.

During the blanking period, since the clock signal CLKA is at a high level, and the voltage of the node H may be maintained until the blanking period, the fourth transistor M4 may transfer a high-level signal to the node N, and the voltage of the node N is at a high level. Since voltages of the clock signal CLKA and the node H are at high levels, the twenty-third transistor M23 and the twenty-second transistor M22 are both turned on to transmit the low-level first voltage signal provided by the first voltage signal terminal VGL1 to the first pull-down node $QB_A$, so that a voltage of the first pull-down node $QB_A$ becomes at a low level. Since the clock signal CLKA is at the high level, the fifth transistor M5 and the sixth transistor M6 are turned on to transmit the signal of the node N to the pull-up node Q<N>, so that the voltage of the pull-up node Q<N> becomes at a high level. After the voltage of the pull-up node Q<N> becomes at the high level, the first output signal terminal OUT1<N> starts to output the first sub-signal of the first gate signal, and the second output signal terminal OUT2<N> starts to output the first sub-signal of the second gate signal.

When a signal provided by an external voltage signal terminal makes a voltage of the second pull-down node $QB_B$ be at a high level, the sixteenth transistor M16, the seventeenth transistor M17, the twenty-seventh transistor M27, the thirtieth transistor M30, and the thirty-third transistor M33 are turned on. The sixteenth transistor M16 and the seventeenth transistor M17 may transmit the first voltage signal to the pull-up node Q<N> and the leakage prevention node OFF<N> to reset the pull-up node Q<N> and the leakage prevention node OFF<N>. The twenty-seventh transistor M27 may transmit the first voltage signal to the cascade output signal terminal CR<N> to reset the cascade output signal terminal CR<N>. The thirtieth transistor M30 and the thirty-third transistor M33 may transmit the second voltage signal to the first output signal terminal OUT1<N> and the second output signal terminal OUT2<N> to reset the first output signal terminal OUT1<N> and the second output signal terminal OUT2<N>.

In the above image frame, the clock signal CLKE is the same as the clock signal CLKF, the first voltage signal and the second voltage signal are, for example, always low-level signals, and the power supply voltage signal provided by the power supply voltage signal terminal VDD is always a high-level signal, which are not shown in FIG. 1E. In the image frame, the first voltage signal and the second voltage signal are low-level signals and may be the same or different, which is not limited in the embodiments of the present disclosure.

It can be understood by those skilled in the art that, the high level and the low level in the embodiments of the present disclosure are relative values. For example, the high level is 15 V and the low level is 5 V. The low level is not limited to a level less than or equal to 0 V.

A timing diagram shown in FIG. 1E corresponds to a condition that the transistors in the shift register 130 are all N-type transistors, which is only an example.

It can be understood by those skilled in the art that descriptions of the structures and the number of shift registers 130 included in the gate driver circuit 13 and the number and the types of the control signal lines 132 in the above are all exemplary, and the structures and the number of shift registers 130 and the number and the types of the control signal lines 132 in the embodiments of the present disclosure are not limited accordingly.

Figure 1F:
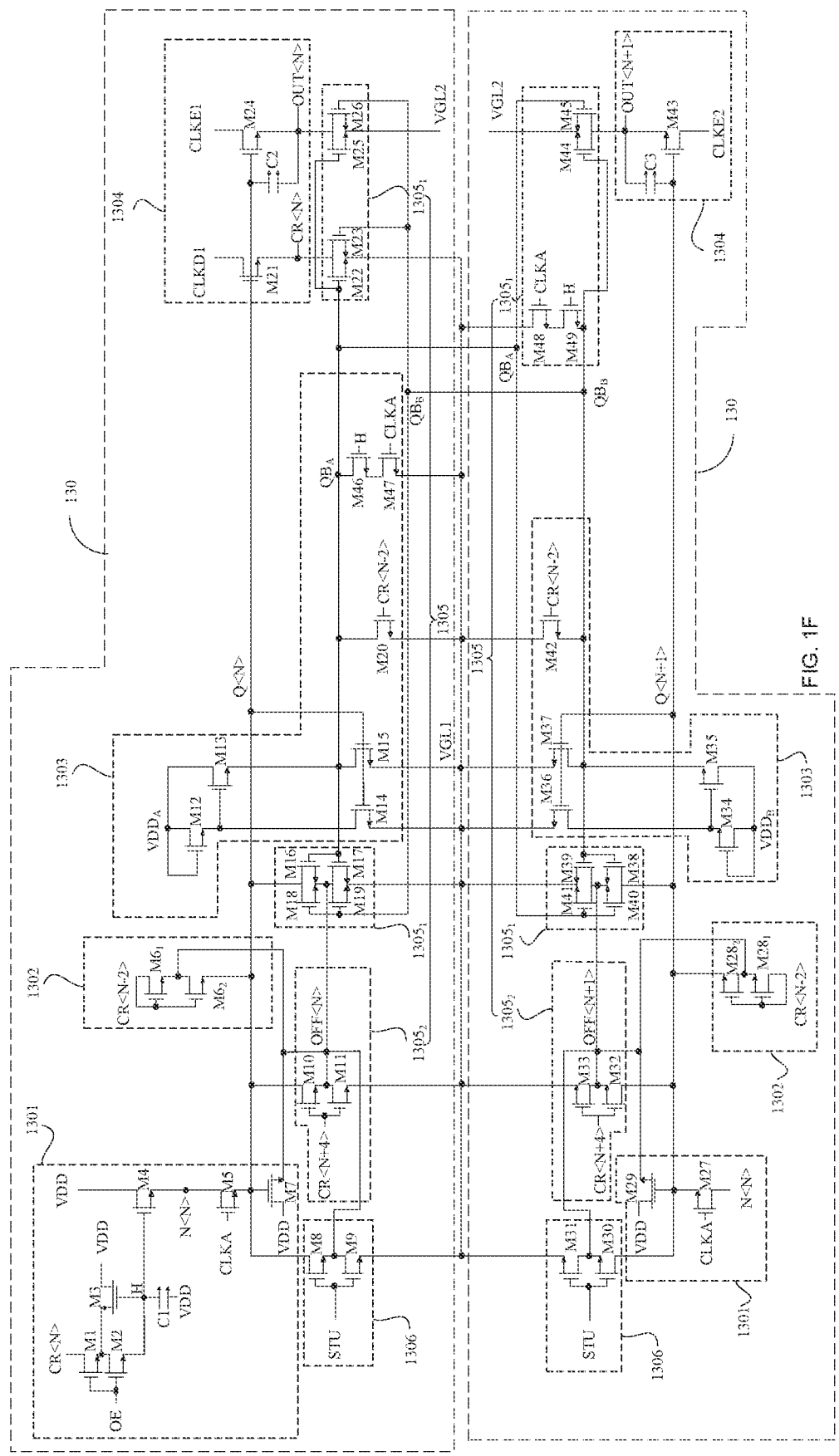
FIG. 1F is a diagram showing a structure of an equivalent circuit of another shift register, in accordance with some embodiments of the present disclosure.

In some other embodiments, referring to FIG. 1F, the shift register 130 includes a blanking input sub-circuit 1301, a display input sub-circuit 1302, a control sub-circuit 1303, a output sub-circuit 1304, a reset sub-circuit 1305, and a global reset sub-circuit 1306.

The blanking input sub-circuit 1301 includes, for example, a first transistor M1, a second transistor M2, a third transistor M3, a fourth transistor M4, a fifth transistor M5, a seventh transistor M7, and a first capacitor C1.

A gate of the first transistor M1 is coupled to a random signal terminal OE, a first electrode of the first transistor M1 is coupled to a cascade output signal terminal CR<N>, and a second electrode of the first transistor M1 is coupled to a first electrode of a second transistor M2. A gate of the second transistor M2 is coupled to the random signal terminal OE, and a second electrode of the second transistor M2 is coupled to a node H. A gate of the third transistor M3 is coupled to the node H, a first electrode of the third transistor M3 is coupled to a power supply voltage signal terminal VDD, and a second electrode of the third transistor M3 is coupled to the second electrode of the first transistor M1. A date of the fourth transistor M4 is coupled to the node H, a first electrode of the fourth transistor M4 is coupled to the power supply voltage signal terminal VDD, and a second electrode of the fourth transistor M4 is coupled to a node N<N>. A gate of the fifth transistor M5 is coupled to a clock signal terminal CLKA, a first electrode of the fifth transistor M5 is coupled to the node N<N>, and a second electrode of the fifth transistor M5 is coupled to a pull-up node Q<N>. A gate of the seventh transistor M7 is coupled to the pull-up node Q<N>, a first electrode of the seventh transistor M7 is coupled to the power supply voltage signal terminal VDD, and a second electrode of the seventh transistor M7 is coupled to a leakage prevention node OFF<N>. One end of the first capacitor C1 is coupled to the node H, and another end of the first capacitor C1 is coupled to the power supply voltage signal terminal VDD.

For example, the display input sub-circuit 1302 includes two sixth transistors M6, and the two sixth transistors are a sixth transistor $M6_1$ and a sixth transistor $M6_2$. A gate and a first electrode of the sixth transistor $M6_1$ are coupled to a cascade output signal terminal CR<N−2>, and a second electrode of the sixth transistor $M6_1$ is coupled to a first electrode of the sixth transistor $M6_2$. A gate of the sixth transistor $M6_2$ is coupled to the cascade output signal terminal CR<N−2>, the first electrode of the sixth transistor $M6_2$ is further coupled to the leakage prevention node OFF<N>, and a second electrode of the sixth transistor $M6_2$ is coupled to the pull-up node Q<N>.

The control sub-circuit 1303 includes, for example, a twelfth transistor M12, a thirteenth transistor M13, a fourteenth transistor M14, a fifteenth transistor M15, a twentieth transistor M20, a forty-sixth transistor M46, and a forty-seventh transistor M47.

A gate and a first electrode of the twelfth transistor M12 are coupled to a power supply voltage signal terminal $VDD_A$, and a second electrode of the twelfth transistor M12 is coupled to a gate of the thirteenth transistor M13. A first electrode of the thirteenth transistor M13 is coupled to the power supply voltage signal terminal $VDD_A$, and a second electrode of the thirteenth transistor M13 is coupled to a first pull-down node $QB_A$. A gate of the fourteenth transistor M14 is coupled to the pull-up node Q<N>, a first electrode of the fourteenth transistor M14 is coupled to the gate of the thirteenth transistor M13, and a second electrode of the fourteenth transistor M14 is coupled to a first voltage signal terminal VGL1. A gate of the fifteenth transistor M15 is coupled to the pull-up node Q<N>, a first electrode of the fifteenth transistor M15 is coupled to the first pull-down node $QB_A$, and a second electrode of the fifteenth transistor M15 is coupled to the first voltage signal terminal VGL1. A gate of the twentieth transistor M20 is coupled to the cascade output signal terminal CR<N−2>, a first electrode of the twentieth transistor M20 is coupled to the first pull-down node $QB_A$, and a second electrode of the twentieth transistor M20 is coupled to the first voltage signal terminal VGL1. A gate of the forty-sixth transistor M46 is coupled to the node H, a first electrode of the forty-sixth transistor M46 is coupled to the first pull-down node $QB_A$, and a second electrode of the forty-sixth transistor M46 is coupled to a second electrode of the forty-seventh transistor M47. A gate of the forty-seventh transistor M47 is coupled to the clock signal terminal CLKA, and a first electrode of the forty-seventh transistor M47 is coupled to the first voltage signal terminal VGL1.

The output sub-circuit 1304 includes, for example, a twenty-first transistor M21, a twenty-fourth transistor M24, and a second capacitor C2.

A gate of the twenty-first transistor M21 is coupled to the pull-up node Q<N>, a first electrode of the twenty-first transistor M21 is coupled to a clock signal terminal $CLKD_1$, and a second electrode of the twenty-first transistor M21 is coupled to the cascade output signal terminal CR<N>. A gate of the twenty-fourth transistor M24 is coupled to the pull-up node Q<N>, a first electrode of the twenty-fourth transistor M24 is coupled to a clock signal terminal $CLKE_1$, and a second electrode of the twenty-fourth transistor M24 is coupled to an output signal terminal OUT<N>. One end of the second capacitor C2 is coupled to the gate of the twenty-fourth transistor M24, and another end of the second capacitor C2 is coupled to the output signal terminal OUT<N>.

On this basis, referring to the pixel driver circuit 12 shown in FIG. 1B, since the shift register 130 in FIG. 1F has only a single output signal terminal OUT<N>, the first gate signal received by the first gate signal terminal G1 in the pixel driver circuit 12 is the same as the second gate signal received by the second gate signal terminal G2 in the pixel driver circuit 12.

The reset sub-circuit 1305 is configured to reset the pull-up node Q<N>, the leakage prevention node OFF<N>, and the output sub-circuit 1304. The reset sub-circuit 1305 includes, for example, a first reset sub-circuit $1305_1$ and a second reset sub-circuit $1305_2$. The first reset sub-circuit $1305_1$ is configured to reset the pull-up node Q<N>, the leakage prevention node OFF<N>, and the output sub-circuit 1304, and the second reset sub-circuit $1305_2$ is configured to reset the pull-up node Q<N> and the leakage prevention node OFF<N>.

The first reset sub-circuit $1305_1$ includes, for example, a sixteenth transistor M16, a seventeenth transistor M17, an eighteenth transistor M18, a nineteenth transistor M19, a twenty-second transistor M22, a twenty-third transistor M23, a twenty-fifth transistor M25, and a twenty-sixth transistor M26.

A gate of the sixteenth transistor M16 is coupled to the first pull-down node $QB_A$, a first electrode of the sixteenth transistor M16 is coupled to a second electrode of the seventeenth transistor M17, and a second electrode of the sixteenth transistor M16 is coupled to the pull-up node Q<N>. A gate of the seventeenth transistor M17 is coupled to the first pull-down node $QB_A$, and a first electrode of the seventeenth transistor M17 is coupled to the first voltage signal terminal VGL1. A gate of the eighteenth transistor M18 is coupled to a second pull-down node $QB_B$, a first electrode of the eighteenth transistor M18 is coupled to a second electrode of the nineteenth transistor M19, and a second electrode of the eighteenth transistor M18 is coupled to the pull-up node Q<N>. A gate of the nineteenth transistor M19 is coupled to the second pull-down node $QB_B$, and a first electrode of the nineteenth transistor M19 is coupled to the first voltage signal terminal VGL1. A gate of the twenty-second transistor M22 is coupled to the first pull-down node $QB_A$, a first electrode of the twenty-second transistor M22 is coupled to the first voltage signal terminal VGL1, and a second electrode of the twenty-second transistor M22 is coupled to the cascade output signal terminal CR<N>. A gate of the twenty-third transistor M23 is coupled to the second pull-down node $QB_B$, a first electrode of the twenty-third transistor M23 is coupled to the first voltage signal terminal VGL1, and a second electrode of the twenty-third transistor M23 is coupled to the cascade output signal terminal CR<N>. A gate of the twenty-fifth transistor M25 is coupled to the first pull-down node $QB_A$, a first electrode of the twenty-fifth transistor M25 is coupled to a second voltage signal terminal VGL2, and a second electrode of the twenty-fifth transistor M25 is coupled to the output signal terminal OUT<N>. A gate of the twenty-sixth transistor M26 is coupled to the second pull-down node $QB_B$, a first electrode of the twenty-sixth transistor M26 is coupled to the second voltage signal terminal VGL2, and a second electrode of the twenty-sixth transistor M26 is coupled to the output signal terminal OUT<N>.

The second reset sub-circuit $1305_2$ includes, for example, a tenth transistor M10 and an eleventh transistor M11.

A gate of the tenth transistor M10 is coupled to a cascade output signal terminal CR<N+4>, a first electrode of the tenth transistor M10 is coupled to a second electrode of the eleventh transistor M11, and a second electrode of the tenth transistor M10 is coupled to the pull-up node Q<N>. A gate of the eleventh transistor M11 is coupled to the cascade output signal terminal CR<N+4>, a first electrode of the eleventh transistor M11 is coupled to the first voltage signal terminal VGL1, and the second electrode of the eleventh transistor M11 is further coupled to the leakage prevention node OFF<N>.

The global reset sub-circuit 1306 includes, for example, an eighth transistor M8 and a ninth transistor M9.

A gate of the eighth transistor M8 is coupled to an input signal terminal STU, a first electrode of the eighth transistor M8 is coupled to a second electrode of the ninth transistor M9, and a second electrode of the eighth transistor M8 is coupled to the pull-up node Q<N>. A gate of the ninth transistor M9 is coupled to the input signal terminal STU, a first electrode of the ninth transistor M9 is coupled to the first voltage signal terminal VGL1, and the second electrode of the ninth transistor M9 is further coupled to the leakage prevention node OFF<N>.

The foregoing is a description of the structure of the Nth shift register in FIG. 1F. Referring to FIG. 1F, a structure of an (N+1)th shift register is similar to the structure of the Nth shift register. The Nth shift register and the (N+1)th shift register share part of transistors. For example, referring to FIG. 1F, the (N+1)th shift register includes: a blanking input sub-circuit 1301 composed of a twenty-seventh transistor M27 and a twenty-ninth transistor M29; a display input sub-circuit 1302 composed of two twenty-eighth transistors M28$_1$ and M28$_2$, a control sub-circuit 1303 composed of a thirty-fourth transistor M34, a thirty-fifth transistor M35, a thirty-sixth transistor M36, a thirty-seventh transistor M37, and a forty-second transistor M42; an output sub-circuit 1304 composed of a forty-third transistor M43 and a third capacitor C3; a first reset sub-circuit 1305$_1$, which is composed of a thirty-eighth transistor M38, a thirty-ninth transistor M39, a fortieth transistor M40, a forty-first transistor M41, a forty-fourth transistor M44, a forty-fifth transistor M45, a forty-eighth transistor M48, and a forty-ninth transistor M49, in a reset sub-circuit 1305; a second reset sub-circuit 1305$_2$, which is composed of a thirty-second transistor M32 and a thirty-third transistor M33, in the reset sub-circuit 1305; and a global reset sub-circuit 1306 composed of a thirtieth transistor M30 and a thirty-first transistor M31.

The blanking input sub-circuit 1301 in the (N+1)th shift register and the blanking input sub-circuit 1301 in the Nth shift register share the first transistor M1, the second transistor M2, the third transistor M3, the fourth transistor M4, and the first capacitor C1.

The twelfth transistor M12, the thirteenth transistor M13, the fourteenth transistor M14, and the fifteenth transistor M15 in the Nth shift register and the thirty-fourth transistor M34, the thirty-fifth transistor M35, the thirty-sixth transistor M36, and the thirty-seventh transistor M37 in the (N+1)th shift register are used for power control. Therefore, these transistors may be referred to as power control transistors.

The twenty-fourth transistor M24 in the Nth shift register and the forty-third transistor M43 in the (N+1)th shift register are each used to output a gate signal (used as both the first gate signal and the second gate signal) to the pixel driver circuits 12. Therefore, these transistors may be referred to as output transistors.

It will be noted that referring to FIG. 1D, the global reset signal terminal TRST controls the global reset sub-circuit 1306, while referring to FIG. 1F, the input signal terminal STU controls the global reset sub-circuit 1306. Therefore, the input signal provided by the input signal terminal STU may be understood as a global reset signal, and the global reset signal may be understood as a general term of this kind of signals that may control the global reset sub-circuit 1306. Of course, it is not only the input signal that can be used as the global reset signal, another gate drive signal may also be used as the global reset signal, as long as the gate drive signal can control the global reset sub-circuit 1306 to operation normally.

It will be noted that the cascade output signal terminal CR<N> is a cascade output signal terminal of the Nth shift register, the cascade output signal terminal CR<N+4> is a cascade output signal terminal of the (N+4)th shift register, and the cascade output signal terminal CR<N−2> is a cascade output signal terminal of the (N−2)th shift register, N is greater than 2. Every two shift registers 130 at least include one cascade output signal terminal CR and each shift register 130 includes one output signal terminal OUT. The cascade output signal terminal CR of the Nth shift register 130 is configured to be coupled to other shift registers 130. For example, referring to FIG. 1F, the Nth shift register is coupled to the (N−2)th and (N+4)th shift registers. A cascade output signal provided by the cascade output signal terminal CR<N−2> of the (N−2)th shift register may be used as an input signal of the display input sub-circuit 1302 in the Nth shift register 130, such as a signal received by the gates of the sixth transistors M6, and a control signal of the control sub-circuit 1303 in the Nth shift register 130, such as the signal received by the gate of the twentieth transistor M20. A cascade output signal provided by the cascade output signal terminal CR<N+4> of the (N+4)th shift register 130 may be used as one of row reset signals, and a row reset signal is configured to control the second reset sub-circuit 1305$_2$ to operate. Referring to FIG. 1D, it can be understood by those skilled in the art that the reset signal STD provided by the reset signal terminal STD is also one of the row reset signals. For example, in the gate driver circuit 13, the second reset sub-circuits 1305$_2$ in last four shift registers 130 are coupled to the reset signal terminal STD, and the second reset sub-circuits 1305$_2$ of the Nth shift register in the remaining shift registers 130 are, for example, coupled to the cascade output signal terminal CR<N+4>.

The foregoing is a description of the structure of another shift register 130 in FIG. 1F. Since the structure of the shift register 130 in FIG. 1F is similar to the structure of the shift register 130 in FIG. 1D, and operating principles of the sub-circuits are the same or similar, an operating principle of the shift register 130 in FIG. 1F may be fully understood by those skilled in the art from the description of an operating principle of the shift register 130 in FIG. 1D, which will not be repeated.

For example, referring to FIGS. 1D and 1F, a plurality of transistors included in the Nth shift register 130 and a plurality of transistors included in the (N+1)th shift register 130 are all referred to as first thin film transistors. A plurality of first thin film transistors included in each shift register 130 may be divided into a plurality of thin film transistor groups 131, and each thin film transistor group 131 at least includes one first thin film transistor. For example, each sub-circuit included in the Nth shift register 130 includes at least one thin film transistor group 131.

Figure 2A:
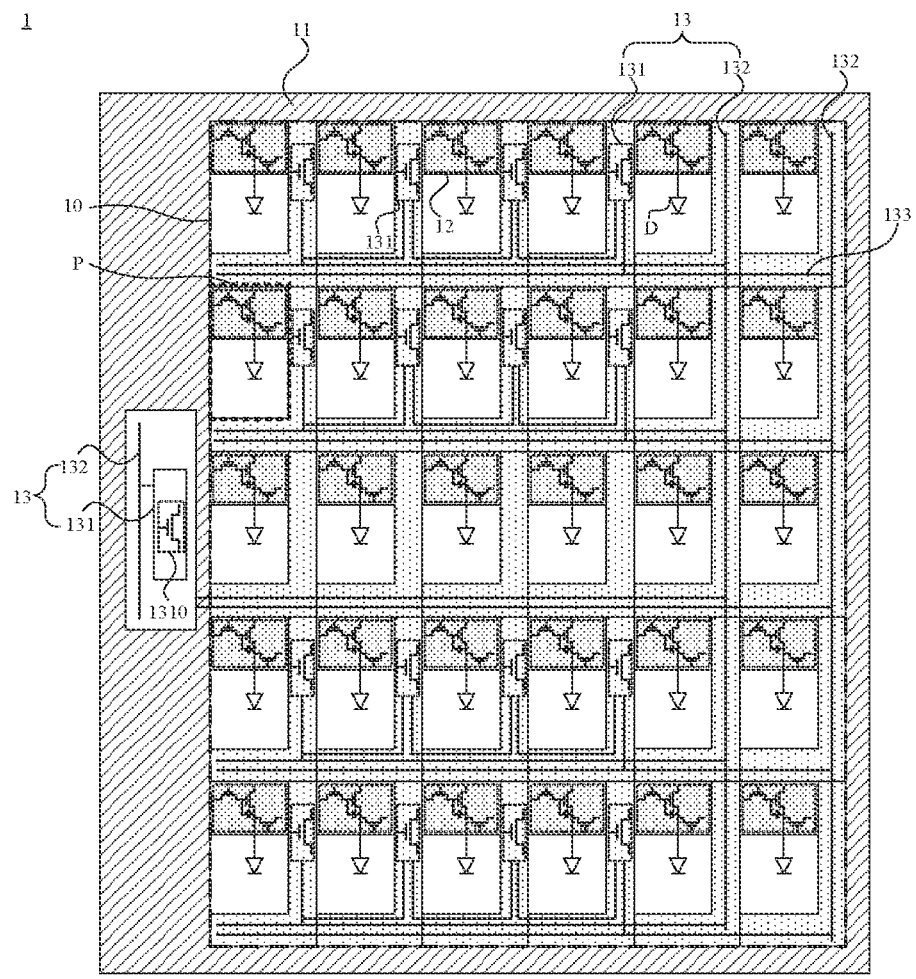
FIG. 2A is a diagram showing a structure of another display panel, in accordance with some embodiments of the present disclosure.

Referring to FIGS. 1A and 2A, at least one thin film transistor group 131 is located in the display region 10 and distributed between adjacent sub-pixels P in a same row of sub-pixels. Each thin film transistor group 131 includes, for example, one first thin film transistor 1310.

In FIG. 1A, all the thin film transistor groups 131 included in the gate driver circuit 13 are located in the display region 10, and the thin film transistor groups 131 included in each shift register 130 each are distributed in a region between adjacent sub-pixels P in the same row of sub-pixels P.

In FIG. 2A, a part of the thin film transistor groups 131 included in the gate driver circuit 13 are located in the non-display region 11, and the part of thin film transistor groups 131 located in the non-display region 11 constitute, for example, one shift register 130. The remaining part of the thin film transistor groups 131 are located in the display region 10, and the remaining part of thin film transistor groups 131 located in the display region 10 constitute, for example, multiple shift registers 130. Thin film transistor groups 131 included in each shift register 130 in the multiple shift registers 130 each are distributed in a region between adjacent sub-pixels P in the same row of sub-pixels P. The thin film transistor groups 131 located in the non-display region 11 are coupled to thin film transistor group(s) 131 located in the display region 10.

At least a portion of the gate driver circuit 13 may be located in the display region 10. Therefore, in a case where the output sub-circuit 1304 is located in the display region 10, referring to FIG. 1D, the first output signal terminal OUT1<N> and the second output signal terminal OUT2<N> coupled to the output sub-circuit 1304 need to be coupled to scanning signal lines. The pixel driver circuits 12 located in the same row are coupled to the same scanning signal lines, and the scanning signal lines are each configured to transmit the first gate signal and the second gate signal to the pixel driver circuits 12.

Figure 2B:
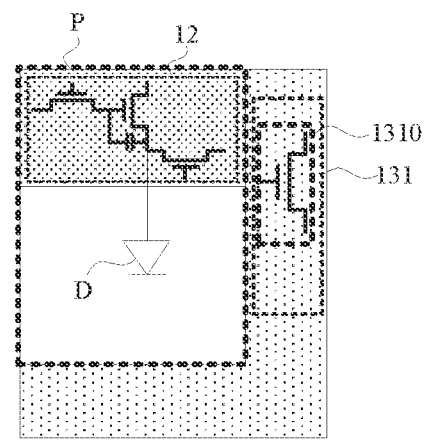
FIG. 2B is a diagram showing a relative position of a region where a sub-pixel is located and a region where a thin film transistor group is located, in accordance with some embodiments of the present disclosure.
Figure 2C:
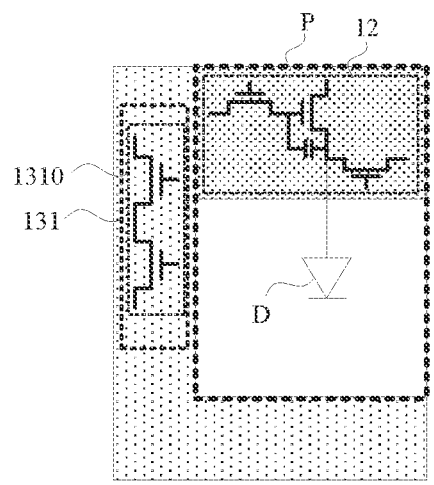
FIG. 2C is a diagram showing another relative position of a region where a sub-pixel is located and a region where a thin film transistor group is located, in accordance with some embodiments of the present disclosure.

FIGS. 2B and 2C are top views each showing a position relationship between a sub-pixel P and a thin film transistor group 131. In FIG. 2B, the thin film transistor group 131 includes, for example, one first thin film transistor 1310, and the thin film transistor group 131 is located on a right side of a region where the pixel driver circuit 12 and the light-emitting device D as a whole is located. In FIG. 2C, the thin film transistor group 131 includes, for example, two first thin film transistors 1310, and the thin film transistor group 131 is located on a left side of a region where the pixel driver circuit 12 and the light-emitting device D as a whole is located. The two distribution manners may both enable the thin film transistor group 131 to be located between adjacent sub-pixels P.

It will be noted that, whether the structure shown in FIG. 2B or 2C is adopted, in a case where the sub-pixel P is a first or last sub-pixel P in a row of sub-pixels P, the sub-pixel P is bound to be adjacent to the non-display region 11, and the thin film transistor group 131 may also be disposed at a position between the sub-pixel P and the non-display region 11. Therefore, it cannot be excluded that a special case of an arrangement position of the first thin film transistor group 131 in a case where the first sub-pixel P and the last sub-pixel P in each row are adjacent to the non-display region 11 due to a case where the thin film transistor group 131 being located between adjacent sub-pixels is defined in the embodiments of the present disclosure.

Figure 3:
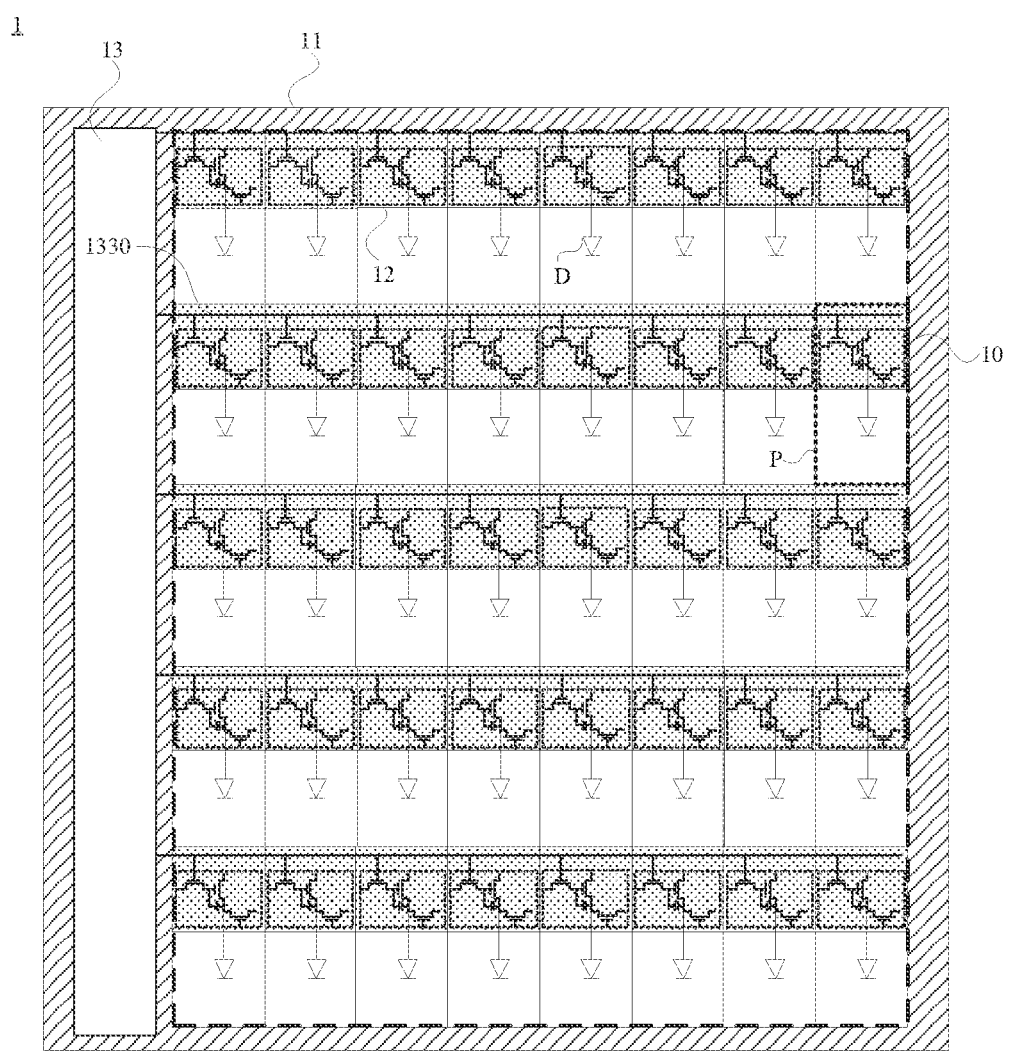
FIG. 3 is a diagram showing a structure of a display panel in the related art.

FIG. 3 is a top view showing a structure of a display panel 1 in the related art. The display panel 1 includes a display region 10 and a non-display region 11 located on a periphery of the display region 10. The display region 10 is provided with a plurality of sub-pixels P therein that are arranged in an array, and each sub-pixel P is provided with a pixel driver circuit 12 and a light-emitting device D coupled to the pixel driver circuit 12 therein. The non-display region 11 is provided with a gate driver circuit 13 therein, an output terminal of the gate driver circuit 13 is coupled to a scanning signal line 1330, and the pixel driver circuits 12 in the same row are coupled to a same scanning signal line 1330. In the display panel 1, all the thin film transistors in the gate driver circuit 13 are located in the non-display region 11, which occupies a large area in the non-display region 11, and in turn leads to a relatively large area of the non-display region 11. For example, both a length and a width of the non-display region 11 are relatively large, which is not conducive to realization of a narrow bezel of the display panel 1.

In the embodiments of the present disclosure, the shift register 130 includes the plurality of thin film transistor groups 131, and at least one thin film transistor group 131 is located in the display region 10 and distributed between adjacent sub-pixels P in the same row of sub-pixels P. Since the at least one thin film transistor group 131 in the shift register 130 is disposed in the display region 10, an area occupied by the gate driver circuit 13 in the non-display region 11 may be reduced. The smaller the area occupied by the gate driver circuit 13 in the non-display region 11 is, the more conducive it is to the realization of the narrow bezel of the display panel 1. As a result, a market competitiveness of the display panel 1 may be improved.

In some embodiments, referring to FIGS. 1A and 2A, at least one of the plurality of control signal lines 132 is located in the display region 10 and in a region outside regions occupied by pixel driver circuits 12 in the display region 10.

For example, a material of the control signal line 132 is a metal material, such as molybdenum (Mo), titanium (Ti), copper (Cu), silver (Ag), or aluminum (Al).

Light-emitting devices D are also disposed in the region outside the regions occupied by the pixel driver circuits 12 in the display region 10. However, a region occupied by the light-emitting device D is a light-emitting region, and the material of the control signal line 132 is the metal material with a low light transmittance, so that the control signal line 132 may not be disposed in the region occupied by the light-emitting device D, and may only be disposed in the display region 10 and in a region outside regions occupied by the pixel driver circuits 12 and the light-emitting devices D in the display region 10.

Referring to FIGS. 2B and 2C, the sub-pixel P includes the pixel driver circuit 12 and the light-emitting device D. A region where the pixel driver circuit 12 and the light-emitting device D as a whole is located is, for example, of a rectangle. With reference to FIGS. 1A, 2B, and 2C or FIGS. 2A, 2B, and 2C, in the display region 10, the light-emitting devices D and the at least one control signal line 132 are disposed in the region outside the regions occupied by the pixel driver circuits 12. A region where the control signal line 132 is located does not overlap with a region where the light-emitting device D is located, and the region where the control signal line 132 is located is on a periphery of the sub-pixel P.

For example, control signal lines 132 extend in a column direction of the plurality of sub-pixels P, and are arranged in a row direction of the plurality of sub-pixels P. For example, referring to FIG. 8A, the column direction is a width direction W of the display panel 1, and the row direction is a length direction L of the display panel 1.

In a case where at least one of the plurality of control signal lines 132 is located in the display region 10, it is beneficial to further reduce the area occupied by the gate driver circuit 13 in the non-display region 11, which is beneficial to further realize the narrow bezel of the display panel 1.

In some embodiments, referring to FIGS. 1A and 2A, at least one of the plurality of control signal lines 132 is located between two adjacent columns of sub-pixels P, and a column of sub-pixels P includes sub-pixels P with a same arrangement order in the rows of sub-pixels P.

For example, second sub-pixels P in the rows of sub-pixels P constitute a second column of sub-pixels P.

It will be understood by those skilled in the art that, a prerequisite for the same arrangement order is that the arrangement rules are the same. For example, for each row of sub-pixels P, the order is from left to right or from right to left, and Mth sub-pixels in the rows of sub-pixels P may constitute an Mth column of sub-pixels P, where M is a positive integer and is less than or equal to a total number of sub-pixels P in each row of sub-pixels P.

In a case where the plurality of sub-pixels P are distributed in a matrix of a plurality of rows and a plurality of columns, the control signal line 132 is disposed between two adjacent columns of sub-pixels P, so that the control signal line 132 may be in a straight line in a top view structure. Therefore, a difficulty of manufacturing the control signal line 132 may be reduced.

In some embodiments, referring to FIGS. 1A and 2A, at least two of the plurality of control signal lines 132 are located in the display region 10 and in the region outside the regions occupied by the pixel driver circuits 12 in the display region 10, and at least one sub-pixel P is disposed between any two of the at least two control signal lines 132.

For example, the plurality of sub-pixels P are distributed in the matrix of the plurality of rows and the plurality of columns, and a single control signal line 132 is disposed between two adjacent columns of sub-pixels P. In an aspect, the control signal line 132 needs to be coupled to the thin film transistor group(s) 131, and different control signal lines 132 may need to be coupled to different thin film transistor groups 131; and therefore, in order to facilitate the coupling of the control signal line 132 and the thin film transistor group(s) 131, a single control signal line 132 is disposed between two adjacent columns of sub-pixels P, so as to make the control signal lines 132 be arranged at intervals and make full use of regions each between two adjacent columns of sub-pixels P. In another aspect, if control signal lines 132 are arranged between the same two adjacent columns of sub-pixels P (for example, three control signal lines 132 are located between the same two adjacent columns of sub-pixels P), a spacing between the two adjacent columns of sub-pixels P will increase. Moreover, in a case where the sub-pixels P are arranged at equal intervals in the display panel 1, the spacing between any two adjacent columns of sub-pixels P will be large, which will reduce pixels per inch (PPI) of the display panel 1. Therefore, in the embodiments of the present disclosure, the single control signal line 132 is disposed between two adjacent columns of sub-pixels P, which may ensure that the display panel 1 has high pixels per inch.

In some embodiments, referring to FIG. 1A, each of the thin film transistor groups 131 included in the shift register 130 is located between adjacent sub-pixels P in the same row of sub-pixels P, and there is at least one sub-pixel P between any two thin film transistor groups 131 in the row direction.

All the thin film transistor groups 131 included in each shift register 130 are located in the display region 10. Moreover, at most one thin film transistor group 131 is disposed between two adjacent sub-pixels P in the same row of sub-pixels P. For example, in a case where there is a large number of sub-pixels P in the same row, thin film transistor groups 131 may be disposed between some adjacent sub-pixels P in the same row; and for two adjacent thin film transistor groups 131, there may be one or more sub-pixels P between the two thin film transistor groups 131.

In a case where all the thin film transistor groups 131 included in the shift register 130 are located in the display region 10, the area occupied by the gate driver circuit 13 in the non-display region 11 may be minimized. In this way, the narrow bezel of the display panel 1 may be realized.

Figure 4A:
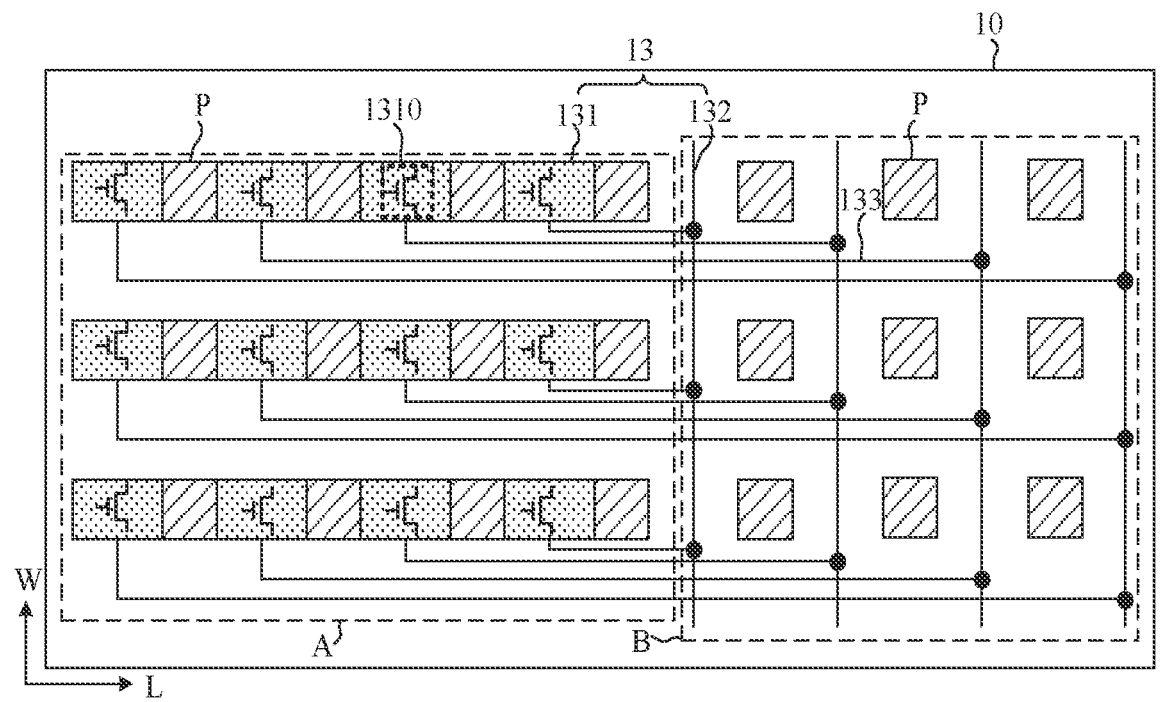
FIGS. 4A to 4C are distribution diagrams of thin film transistor groups, control signal lines and connection lines in a display region, in accordance with some embodiments of the present disclosure.
Figure 4B:
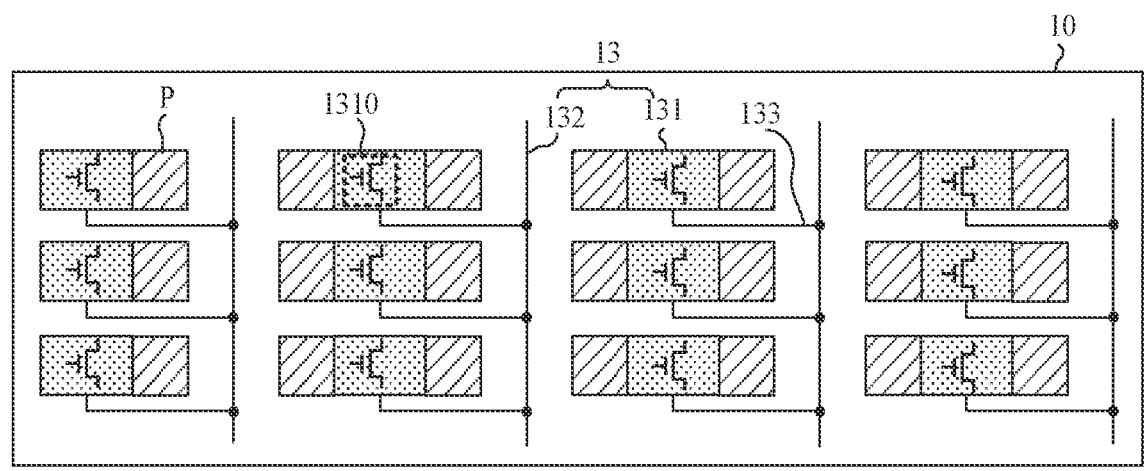

In some embodiments, referring to FIGS. 4A and 4B, which are distribution diagrams of the thin film transistor group(s) 131 and the control signal line(s) 132 in the display region 10, in the thin film transistor group(s) 131 and the control signal line(s) 132 that are located in the display region 10, a thin film transistor group 131 and a control signal line 132 have at least one sub-pixel P therebetween.

At least one sub-pixel P is disposed between the thin film transistor group 131 and the control signal line 132, so that the thin film transistor group 131 and the control signal line 132 are not disposed together between adjacent sub-pixels P.

Figure 4C:
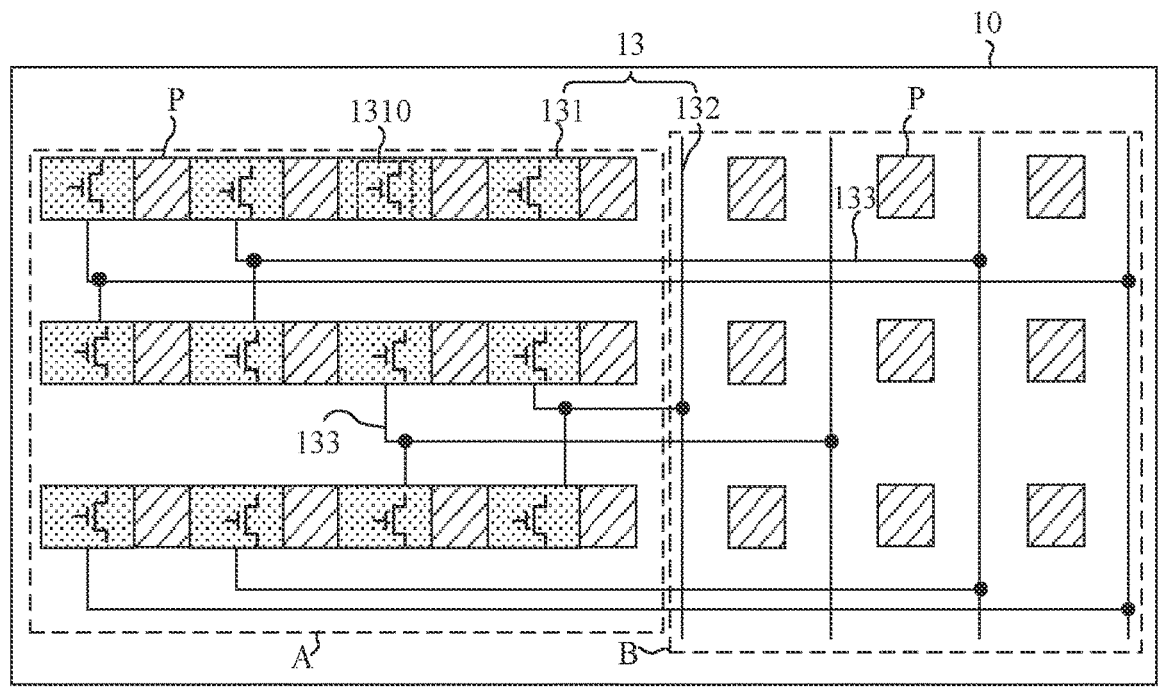

For example, referring to FIGS. 4A and 4C, when the gate driver circuit 13 is arranged, the thin film transistor groups 131 included in each shift register 130 are disposed in a region in the display panel 1, such as a region A, the control signal lines 132 are disposed in another region in the display panel 1, such as a region B, and the region A and the region B are adjacent to each other. A thin film transistor group 131 located in the region A is coupled to a respective control signal line 132 located in the region B.

As another example, referring to FIG. 4B, when the gate driver circuit 13 is arranged, thin film transistor groups 131, in each shift register 130, coupled to a same control signal line 132 are disposed near the control signal line 132, and no other thin film transistor groups 131 and/or other control signal lines 132 are disposed between each control signal line 132 and thin film transistor groups 131 coupled to the control signal line 132.

At least one sub-pixel P is disposed between the thin film transistor group 131 and the control signal line 132. That is, the thin film transistor group 131 and the control signal line 132 are disposed between different sub-pixels P during the arrangement. In this way, in an aspect, a spacing between adjacent sub-pixels P may be fully utilized, and in another aspect, a decrease in PPI of the display panel 1 caused by a large spacing between adjacent sub-pixels P may be avoided.

In some embodiments, referring to FIGS. 1A, 2A, 4A, 4B, and 4C, the display panel 1 further includes a plurality of connection lines 133 corresponding to a row of sub-pixels P.

A connection line 133 is coupled to at least two thin film transistor groups 131 in a shift register coupled to pixel driver circuits in the row of sub-pixels P, or coupled to one control signal line 132 and at least one thin film transistor group 131 that is in a shift register coupled to pixel driver circuits in the row of sub-pixels P. The connection line 133 is configured to realize a coupling of the at least two thin film transistor groups 131 and a coupling of the thin film transistor group(s) 131 and the control signal line 132.

A material of the connection line 133 is, for example, the same as the material of the control signal line 132. For example, they are both metal materials.

In some embodiments, the connection lines 133 and the control signal lines 132 are disposed in a same layer and made of a same material.

The "same layer" refers to that a film layer for forming a specific pattern is formed by using the same film-forming process, and then a single patterning process is performed to form a layer structure by using the same mask. Depending on different specific patterns, the single patterning process may include multiple exposure, development or etching processes, the specific patterns in the formed layer structure may be continuous or discontinuous, and these specific patterns may also be at different heights or have different thicknesses.

For example, referring to FIGS. 4A and 4C, connection lines 133 are disposed between two adjacent rows of sub-pixels P. The plurality of thin film transistor groups 131 in the shift register 130 are disposed in sequence. For example, the plurality of thin film transistor groups 131 are all disposed in the region A. The plurality of control signal lines 132 are disposed in sequence. For example, the plurality of control signal lines 132 are all disposed in the region B. The plurality of thin film transistor groups 131 are disposed in sequence, that is, there is no control signal line 132 between two thin film transistor groups 131. The plurality of control signal lines 132 are disposed in sequence, that is, there is no thin film transistor group 131 between two control signal lines 132. In this structure, the region A where the thin film transistor groups 131 are located is adjacent to the region B where the control signal lines 132 are located, so that a layout of the gate driver circuit 13 is relatively simple and clear.

Referring to FIG. 4C, thin film transistor groups 131 in two adjacent rows may share the same connection line 133.

Therefore, a spacing between the thin film transistor groups 131 in two adjacent rows may be small, which is beneficial to improving the PPI of the display panel 1.

As another example, referring to FIG. 4B, the thin film transistor groups 131 coupled to the same control signal line 132 are disposed near the control signal line 132, so that thin film transistor groups 131 in two adjacent rows of sub-pixels P have a single connection line 133 therebetween. As a result, the spacing between two adjacent rows of sub-pixels P may be reduced, which is beneficial to improving the PPI of the display panel 1.

It will be noted that FIGS. 4A to 4C only illustrate that the connection line 133 is used to connect the thin film transistor group 131 and the control signal line 132, and do not illustrate that the connection line 133 is further used to connect two thin film transistor groups 131. However, a function of the connection line 133 is not limited because of these drawings, and reference should also be made to other drawings. For example, referring to FIG. 1A, the connection line 133 may be used to connect the thin film transistor group 131 and the control signal line 132, and may also be used to connect two thin film transistor groups 131.

In accordance with specific position arrangements of the thin film transistor groups 131 and the control signal lines 132 in the display panel 1, the coupling of the two thin film transistor groups 131 and the coupling of the thin film transistor group 131 and the control signal line 132 may be realized by flexibly setting positions and the number of the connection lines 133.

Figure 4D:
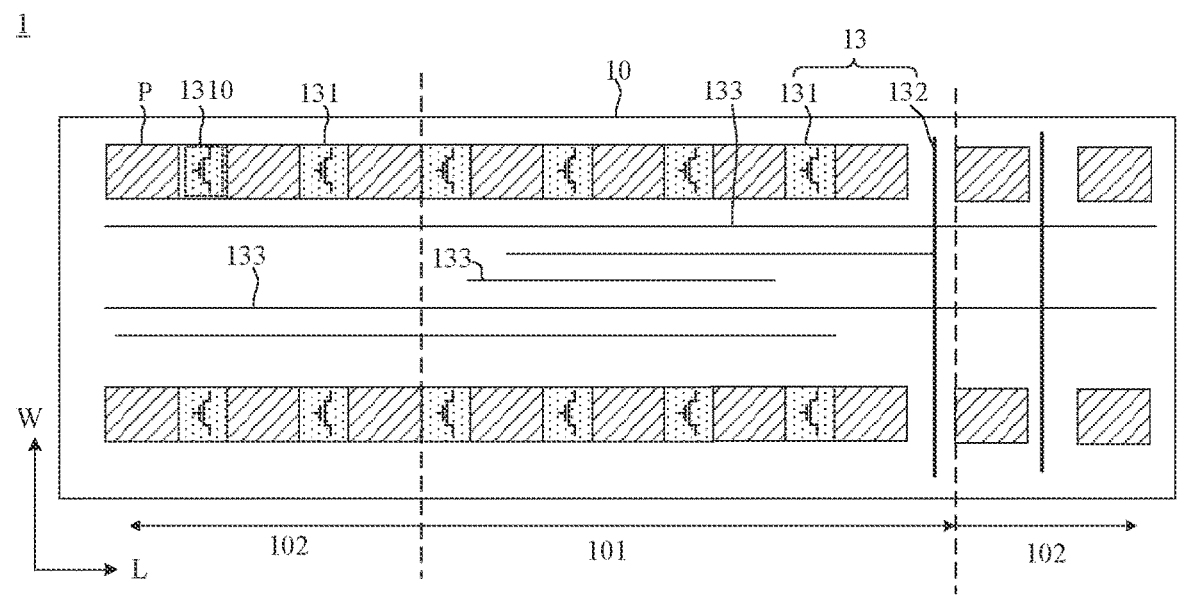
FIG. 4D is a distribution diagram of connection lines of a display panel in a display region, in accordance with some embodiments of the present disclosure.

In some other embodiments, referring to FIG. 4D, in the display region 10, the number of connection lines 133 located between two adjacent rows of sub-pixels P may be different in different regions of the display panel 1. For example, the number of connection lines 133 located between the two adjacent rows of sub-pixels P and in a middle region of the display panel 1 is greater than the number of connection lines 133 located between the two adjacent rows of sub-pixels P and in an edge region of the display panel 1. The middle region and the edge region are defined in the length direction L of the display panel 1. For example, referring to FIG. 4D, the connection lines 133 extend in the length direction L of the display panel 1, and are distributed in a width direction W of the display panel 1. The number of connection lines 133 located in the edge region 102 is less than the number of connection lines 133 located in the middle region 101. Most of the connection lines 133 are disposed in the middle region 101 of the display panel 1, which may reduce lengths of some connection lines 133, thereby reducing signal attenuation and ensuring a signal transmission quality of the display panel 1.

Figure 5A:
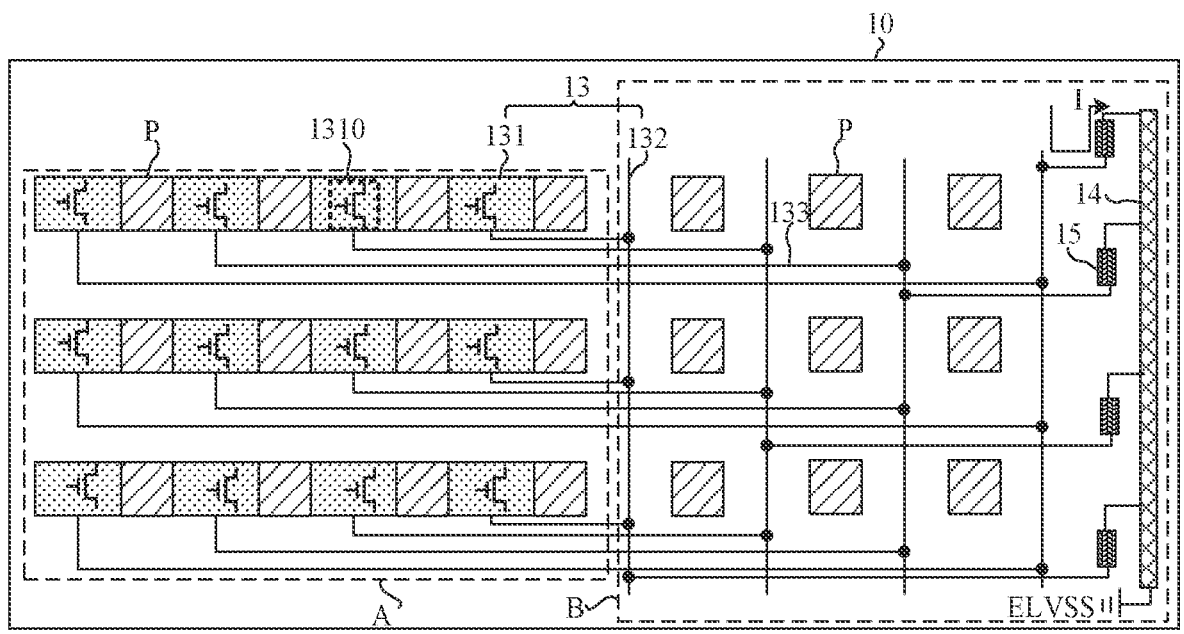
FIGS. 5A to 5B are distribution diagrams of thin film transistor groups, control signal lines, connection lines, second thin film transistors, and electrostatic discharge patterns in the display region, in accordance with some embodiments of the present disclosure.
Figure 5B:
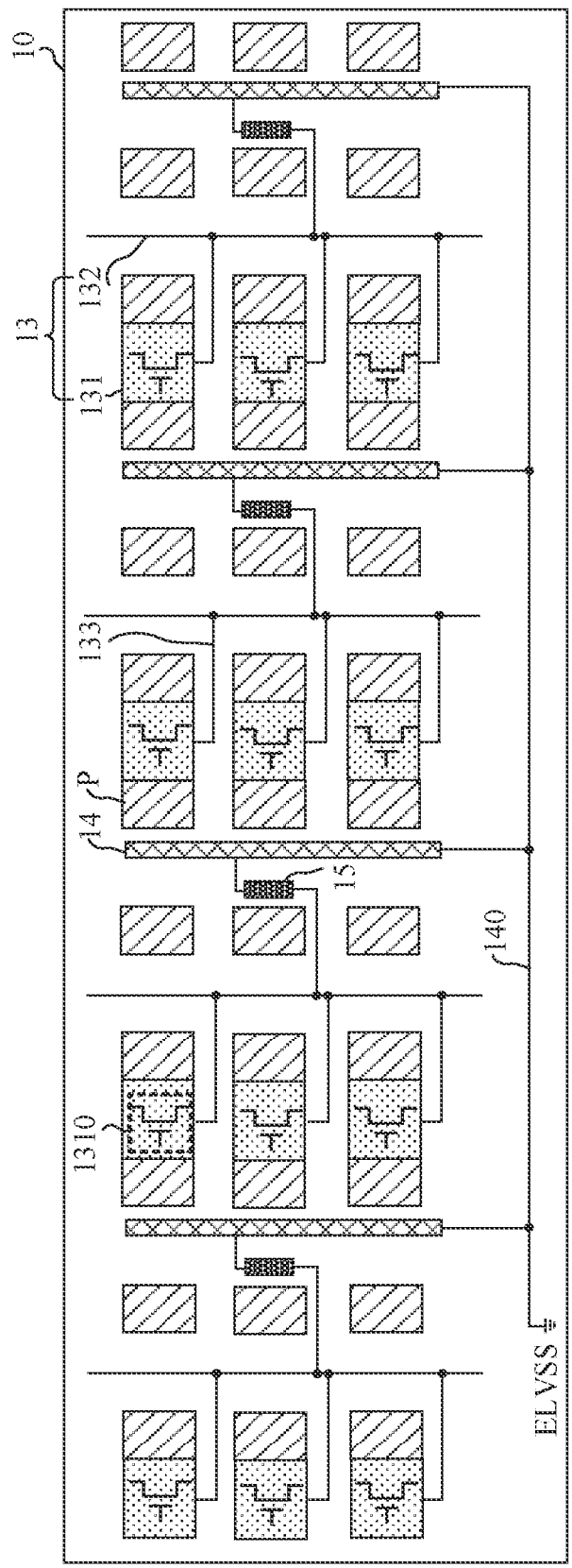
Figure 6:
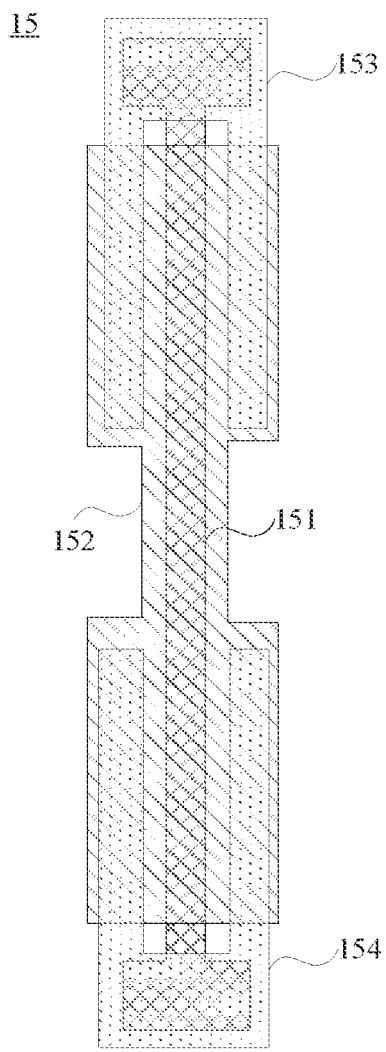
FIG. 6 is a diagram showing a structure of a second thin film transistor, in accordance with some embodiments of the present disclosure.

In some embodiments, referring to FIGS. 5A and 5B, the display panel 1 further includes at least one electrostatic discharge pattern 14 and at least one second thin film transistor 15. Referring to FIG. 6, the second thin film transistor 15 includes a gate (also referred to as a second gate) 152, a first electrode 153, and a second electrode 154. The first electrode 153 of the second thin film transistor 15 is coupled to a control signal line 132, and the second electrode 154 of the second thin film transistor 15 is coupled to an electrostatic discharge pattern 14.

A material of the electrostatic discharge pattern 14 is a conductive material, such as a metal material, and the electrostatic discharge pattern 14 is, for example, disposed in a same layer and made of a same material as the cathode of the light-emitting device D.

Referring to FIGS. 5A and 5B, when there is static electricity on the control signal line 132, the static electricity will cause breakdown of the second gate 152 and the first electrode 153 of the second thin film transistor 15, which causes the second gate 152 of the second thin film transistor 15 to be coupled to the first electrode 153 of the second thin film transistor 15. In this case, the second thin film transistor 15 is equivalent to a diode, which may be unidirectionally conductive. Therefore, an electrostatic current I may be transmitted from the second electrode 154 of the second thin film transistor 15 to the electrostatic discharge pattern 14, so as to achieve a purpose of electrostatic discharge.

Referring to a structural diagram of the second thin film transistor 15 shown in FIG. 6, the first electrode 153 of the second thin film transistor 15 is configured to be coupled to the control signal line 132, and the second electrode 154 is configured to be coupled to the electrostatic discharge pattern 14. The second gate 152 of the second thin film transistor 15 is floating, that is, the second gate 152 of the second thin film transistor 15 is not coupled to other signal lines.

During a manufacturing and testing process of the display panel 1, an accumulation of electrostatic charges may be usually generated in the display panel 1 due to some external factors. When the electrostatic charges are accumulated to a certain amount, electrostatic discharge (ESD) will be generated. The electrostatic discharge lasts for a short time, and a transfer of a large amount of charges in a short period of time will generate extremely high current, which will cause breakdown of a device (or film layer(s) that constitutes the device) in the display panel 1. Therefore, in a process of discharging static electricity, it is necessary to control a magnitude of the current passing through the second thin film transistor 15 to avoid the breakdown of the device in the display panel 1.

Referring to FIG. 6, a length (a dimension in a direction from the first electrode 153 to the second electrode 154) of a second active layer 151 of the second thin film transistor 15 is much greater than a width (a dimension in a direction perpendicular to the direction from the first electrode 153 to the second electrode 154) thereof, and a length (a dimension in the direction from the first electrode 153 to the second electrode 154) of the second gate 152 is also much greater than a width (a dimension in a direction perpendicular to the direction from the first electrode 153 to the second electrode 154) thereof, so that a width-to-length ratio of a channel region of the second thin film transistor 15 is relatively small. The smaller the width-to-length ratio of the channel region of the second thin film transistor 15, the smaller the current passing through the second thin film transistor 15, which is beneficial to preventing the breakdown of the device in the display panel 1. A material of the second active layer 151 is, for example, any of indium gallium zinc oxide (IGZO), polysilicon (p-si), or amorphous silicon (a-si). A material of the second gate 152 is, for example, a metal material, such as at least one of silver or aluminum. A material of the first electrode 153 and the second electrode 154 of the second thin film transistor 15 is, for example, a conductive material, such as at least one of molybdenum, titanium, copper, silver, or aluminum.

In some embodiments, a width of the channel region of the second thin film transistor 15 is in a range of 4 μm to 10 μm, inclusive, and a length thereof is in a range of 100 μm to 300 μm, inclusive.

For example, the width-to-length ratio of the channel region of the second thin film transistor 15 is 6/200. In this case, the width of the channel region is, for example, 6 μm, and the length of the channel region is, for example, 200 μm.

In some embodiments, referring to FIG. 5A, there are a plurality of second thin film transistors 15. First electrodes 153 of the plurality of second thin film transistors 15 are coupled to different control signal lines 132, and second electrodes 154 of the plurality of second thin film transistors 15 are coupled to the same electrostatic discharge pattern 14.

Referring to FIG. 5A, one end of the electrostatic discharge pattern 14 is coupled to a fixed voltage terminal, and the fixed voltage terminal is configured to discharge static electricity on the electrostatic discharge pattern 14.

A voltage at the fixed voltage terminal is, for example, a low-level voltage, such as 0 V. In some other embodiments, the fixed voltage terminal is, for example, the power supply voltage signal terminal ELVSS.

Since static electricity may exists on each control signal line 132, there is a need to provide a second thin film transistor 15 for each control signal line 132. The electrostatic currents I output from the second electrodes 154 of the second thin film transistors 15 may be discharged through the same electrostatic discharge pattern 14. Therefore, in a case where the second electrodes 154 of the plurality of second thin film transistors 15 are coupled to the same electrostatic discharge pattern 14, the number of electrostatic discharge patterns 14 may be reduced, and a coupling relationship between the second thin film transistor 15 and the electrostatic discharge pattern 14 may be simplified, thereby facilitating manufacture of circuits in the display panel 1.

In some embodiments, referring to FIG. 5B, there are a plurality of electrostatic discharge patterns 14 and a plurality of second thin film transistors 15, and an electrostatic discharge pattern 14 is at least coupled to one second thin film transistor 15.

Ends of the plurality of electrostatic discharge patterns 14 are coupled to the same fixed voltage terminal, and the fixed voltage terminal is configured to discharge the static electricity on the electrostatic discharge patterns 14.

Since the layouts of the control signal lines 132 and the thin film transistor groups 131 are different, each electrostatic discharge pattern 14 needs to be coupled to at least one second thin film transistor 15. In this case, there are the plurality of electrostatic discharge patterns 14. In order to reduce the number of fixed voltage terminals that need to be coupled to the electrostatic discharge patterns 14, the ends of all the electrostatic discharge patterns 14 are firstly coupled together through a wire 140, and then an end of the wire 140 is coupled to a fixed voltage terminal, so as to realize static electricity discharge.

In some embodiments, referring to FIGS. 4A and 5A, no control signal line 132 is disposed between any two thin film transistor groups 131.

When the gate driver circuit 13 is arranged, all the thin film transistor groups 131 and all the control signal lines 132 are disposed in the region A and the region B, respectively. In the region A where the thin film transistor groups 131 are located, there is no control signal line 132. In the region B where the control signal lines 132 are located, there is no thin film transistor group 131. As a result, the layout of the gate driver circuit 13 is simple and clear.

In some embodiments, referring to FIGS. 4B and 5B, no other thin film transistor groups 131 and/or other control signal lines 132 are disposed between a control signal line 132 coupled to a thin film transistor group 131 and the thin film transistor group 131.

The control signal line 132 coupled to the thin film transistor group 131 is disposed near the thin film transistor group 131, which is convenient for the thin film transistor group 131 to be coupled to the control signal line 132. As a result, it is beneficial to shorten the length of the connection line 133, reduce the number of connection lines 133 located between two rows of sub-pixels P, and reduce the spacing between two adjacent rows of sub-pixels P, thereby facilitating realization of high PPI of the display panel 1.

Figure 7A:
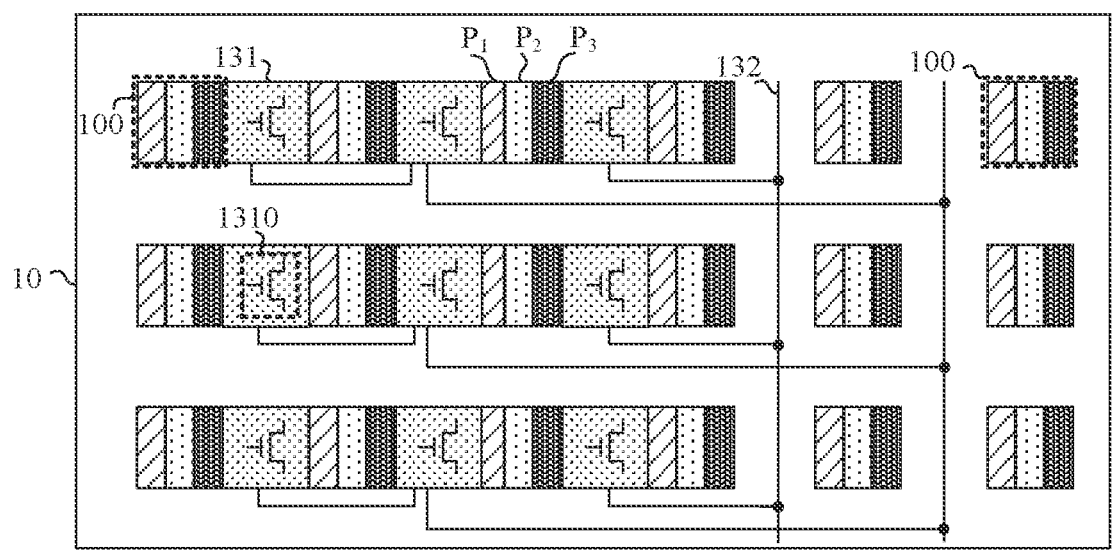
FIGS. 7A to 7C are distribution diagrams of display units, control signal lines and connection lines in the display region, in accordance with some embodiments of the present disclosure.
Figure 7B:
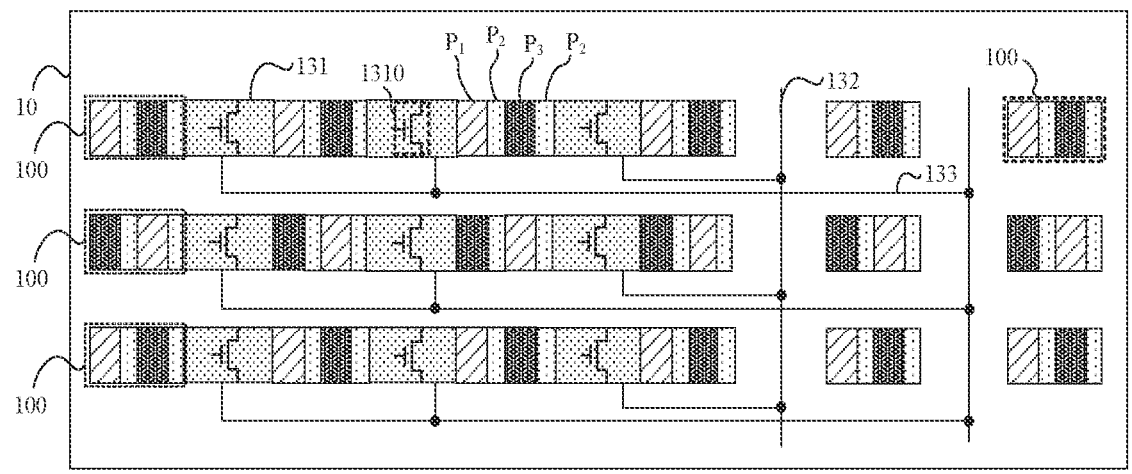

In some embodiments, referring to FIGS. 7A and 7B, each row of sub-pixels P is divided into a plurality of display units 100, and each display unit 100 includes at least two sub-pixels P. Emission colors of sub-pixels P in different display units 100 have a same arrangement order.

Each thin film transistor group 131, located in the display region 10, of the shift register 130 is located between adjacent display units 100.

For example, referring to FIG. 7A, in a case where an arrangement of the sub-pixels P in the display panel 1 adopts a standard RGB mode, each pixel includes three sub-pixels P. The emission colors of the three sub-pixels P are three primary colors, which is, for example, red, green, and blue in sequence. An arrangement of the RGB mode is a most standard arrangement, it divides a square pixel into three equal blocks, and each block is assigned a different color, which is convenient to manufacture the sub-pixels P.

As another example, referring to FIG. 7B, in a case where the arrangement of the sub-pixels P in the display panel 1 adopts an RGB Pentile mode, each display unit 100 includes four sub-pixels P. The emission colors of the four sub-pixels P are, for example, red, green, blue, and green in sequence. An area of a sub-pixel with a red emission color and an area of a sub-pixel with a blue emission color are each greater than an area of a sub-pixel P with a green emission color.

The Pentile arrangement reduces the number of sub-pixels P mainly through a manner of sharing the sub-pixels P by adjacent pixels, so as to achieve an effect of simulating high-resolution by low resolution. A greatest advantage of the Pentile arrangement is in that light transmittance increases, and the same brightness only requires less power consumption. As a result, an endurance ability of the display panel 1 may be improved, and a cost of the display panel 1 may be significantly reduced.

Referring to FIG. 7B, in the same row of sub-pixels P, the emission colors of the sub-pixels P in each display unit 100 have the same arrangement order. For example, in the four sub-pixels P included in each display unit 100 in the first row, the first one is a sub-pixel $P_1$ with a red emission color, the second one is a sub-pixel $P_2$ with a green emission color, the third one is a sub-pixel $P_3$ with a blue emission color, and the fourth one is also the sub-pixel $P_2$ with a green emission color. That is, in each display unit 100, the arrangement order of the emission colors of the sub-pixels P is red, green, blue, and green. However, the emission colors of the sub-pixels P in display units 100 in different rows have different arrangement order. For example, in a second row of sub-pixels P, the arrangement order of the emission colors of the sub-pixels P in each display unit 100 is blue, green, red, and green.

Figure 7C:
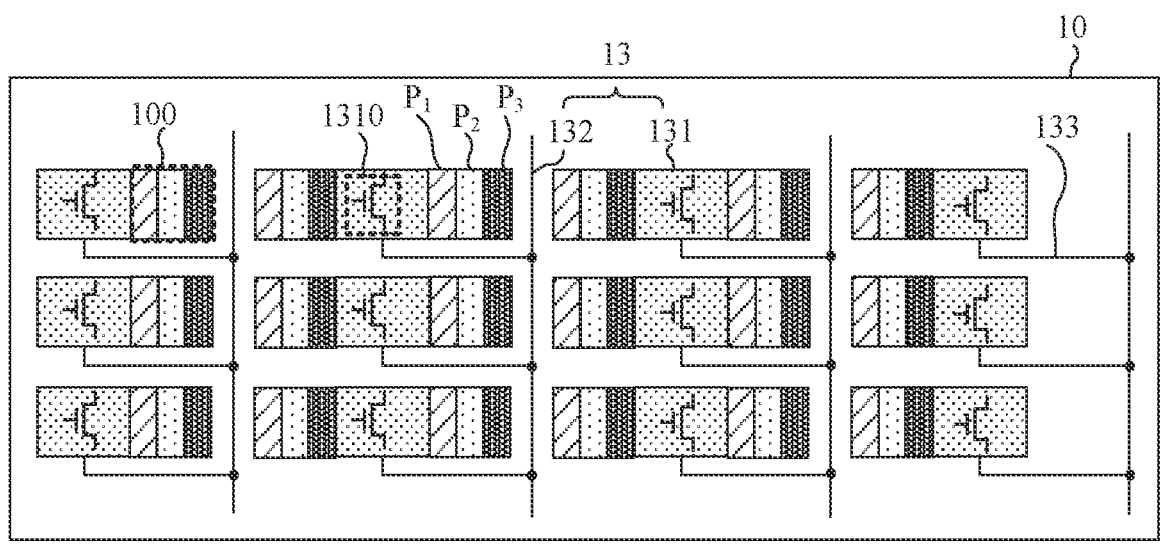

As another example, referring to FIGS. 7A and 7C, each display unit 100 includes three sub-pixels P, the first one is the sub-pixel $P_1$ with a red emission color, the second one is the sub-pixel $P_2$ with a green emission color, and the third one is the sub-pixel $P_3$ with a blue emission color; and the emission colors of the sub-pixels P in display units 100 in different rows have the same arrangement order, i.e., red, green, and blue. In this structure, a display unit 100 is a pixel.

Referring to FIGS. 7A, 7B, and 7C, in a case where the plurality of sub-pixels P in each row of sub-pixels P are divided into the plurality of display units 100, at least one thin film transistor group 131 is located between two adjacent display units 100.

In a case where the thin film transistor group 131 is located between two adjacent display units 100, reference may be made to the description above in a case where the thin film transistor group 131 is located between two adjacent sub-pixels P.

In a case where the plurality of sub-pixels P in each row of sub-pixels P are divided into the plurality of display units 100, and the thin film transistor group 131 is disposed between two adjacent display units 100, a spacing between two adjacent sub-pixels P in each display unit 100 is relatively small. In an aspect, when a display unit 100 serves as a pixel, display of adjacent pixels may be relatively independent, which is beneficial to ensuring the display effect of the display panel 1. In another aspect, since the number of display units 100 is less than the number of sub-pixels P, a vacant region between two adjacent display units 100 is used to arrange the thin film transistor group 131, which is beneficial to improving the PPI of the display panel 1.

In some embodiments, referring to FIGS. 7A, 7B, and 7C, in a case where the at least one of the plurality of control signal lines 132 is located in the display region 10 and in the region outside the regions occupied by the pixel driver circuits 12 in the display region 10, at least one of the plurality of control signal lines 132 is located between two adjacent columns of display units 100, and a column of display units 100 includes display units 100 with a same arrangement order in rows of display units 100.

For example, third display units in the rows of display units 100 may constitute a third column of display units 100.

For example, a control signal line 132 is located between two adjacent columns of display units 100, and there is no thin film transistor group 131 between the two columns of display units 100.

The case where the control signal line 132 is arranged between two adjacent columns of display units 100 has same beneficial effects as the case where the thin film transistor group 131 is arranged between two adjacent display units 100, which will not be repeated.

In some embodiments, referring to FIGS. 7A and 7B, in a case where the thin film transistor group 131 is located between two display units 100, no control signal line 132 is disposed between any two thin film transistor groups 131.

In some other embodiments, referring to FIG. 7C, in a case the thin film transistor group 131 is located between two display units 100, no other thin film transistor groups 131 and/or other control signal lines 132 are disposed between a control signal line 132 coupled to the thin film transistor group 131 and the thin film transistor group 131.

A distance between the thin film transistor group 131 and the control signal line 132 coupled to the thin film transistor group is relatively short. Therefore, a spacing between two adjacent columns of display units 100 may be reduced, which is beneficial to improving the PPI of the display panel 1.

Figure 8A:
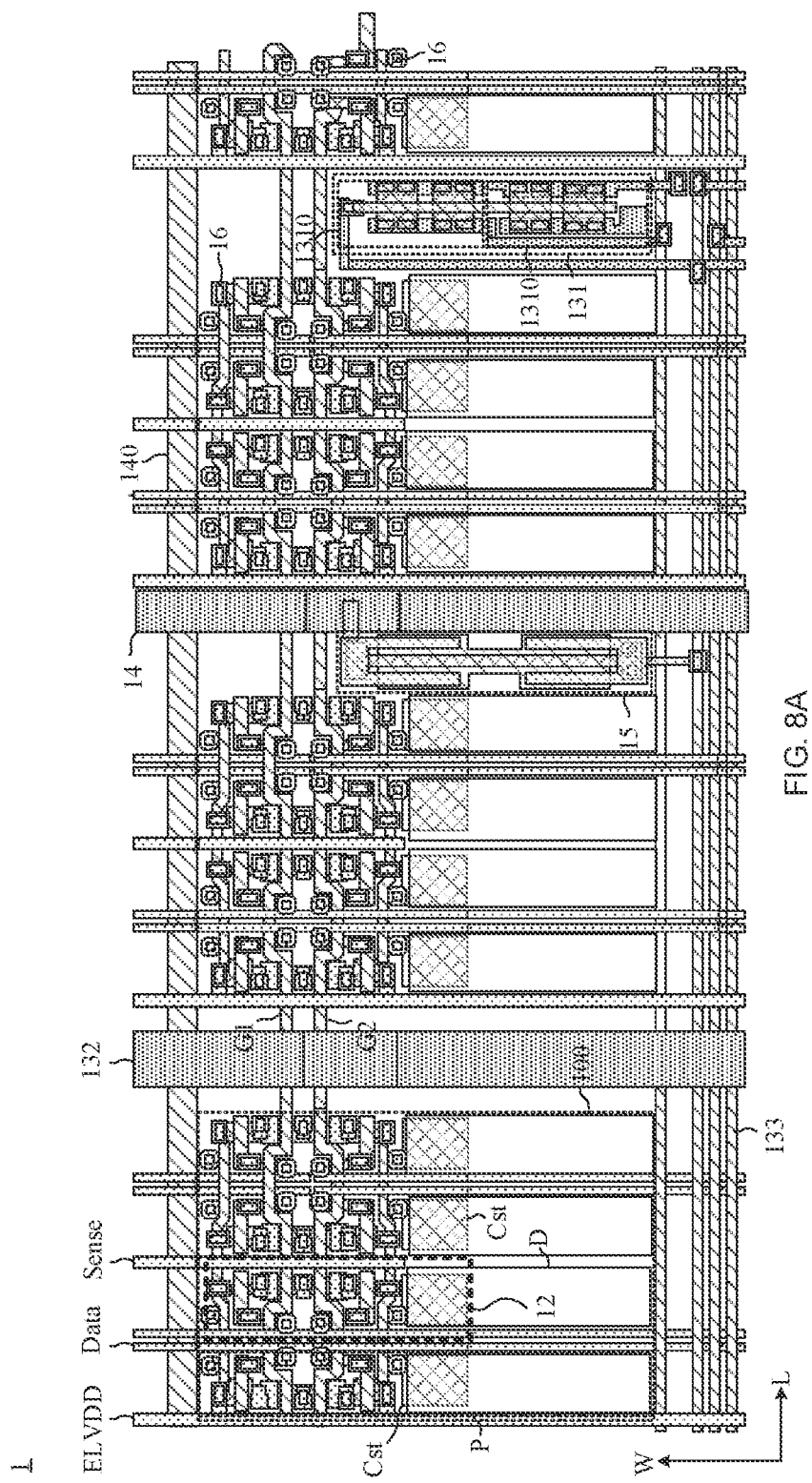
FIGS. 8A to 8E are diagrams showing structures of other display panels, in accordance with some embodiments of the present disclosure.

In some embodiments, referring to FIGS. 2B, 2C, and 8A, light emitted by the light-emitting device D exits through the base substrate. An orthographic projection, on the base substrate, of a portion of the gate driver circuit 13 in the display region 10 does not overlap with orthographic projections, on the base substrate, of the light-emitting device D and the pixel driver circuit 12.

In a case where the light emitted by the light-emitting device D exits through the base substrate, the display panel 1 is a bottom-emission display panel. In a case where the orthographic projection, on the base substrate, of the portion of the gate driver circuit 13 in the display region 10 does not overlap with the orthographic projections, on the base substrate, of the light-emitting device D and the pixel driver circuit 12, the gate driver circuit 13 will not affect an aperture ratio of the display panel 1. A region where the gate driver circuit 13 is located is a non-light-emitting region, and a region where the light-emitting device D is located is a light-emitting region.

In some embodiments, an orthographic projection of the pixel driver circuit 12 on the base substrate does not overlap with an orthographic projection of the light-emitting device D on the base substrate.

In some other embodiments, referring to FIG. 8A, an orthographic projection of the pixel driver circuit 12 on the base substrate partially overlaps with the orthographic projection of the light-emitting device D on the base substrate. Materials of two electrode plates of the storage capacitor Cst in the pixel driver circuit 12 are, for example, transparent conductive materials. A material of one of the electrode plates is the same as a material of a first active layer 1211 of the driving transistor in the pixel driver circuit 12, such as indium gallium zinc oxide. In this case, the electrode plate and the first active layer 1211 may be manufactured simultaneously, so that the number of masks may be reduced. A material of the other of the electrode plates is, for example, indium tin oxide (ITO). In this case, an orthographic projection of the storage capacitor Cst on the base substrate overlaps with the orthographic projection of the light-emitting device D on the base substrate. In this structure, since both the two electrode plates of the storage capacitor Cst are transparent, the storage capacitor Cst may be located in the light-emitting region, and a region where other portions of the pixel driver circuit 12 except the storage capacitor Cst are located is a non-light-emitting region. In a case where the storage capacitor Cst is located in the light-emitting region, the aperture ratio of the display panel 1 may increase.

In some embodiments, referring to FIG. 8A, the at least one thin film transistor group 131 located in the display region includes multiple first thin film transistors 1310, and the multiple first thin film transistors 1310 are arranged in a column.

For example, referring to the display panel 1 shown in FIG. 8A, the thin film transistor group 131 includes two first thin film transistors 1310, and the two first thin film transistors 1310 are arranged in a column, so that a width of the thin film transistor group 131 (in the length direction of the display panel 1) may be reduced. The smaller the width of the thin film transistor group 131 is, the smaller the spacing between adjacent sub-pixels P or between two adjacent display units 100 may be, so that the aperture ratio of the display panel 1 may increase.

Figure 8B:
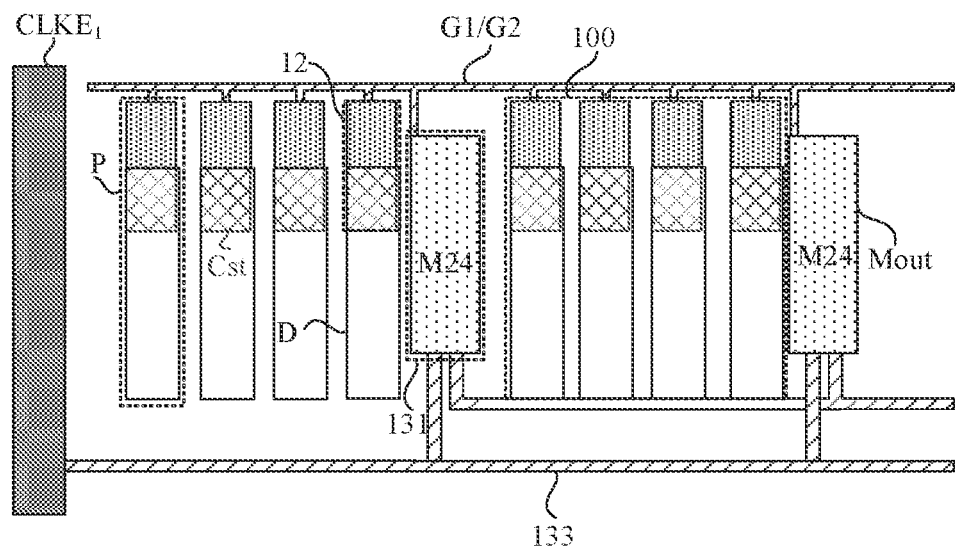

In some embodiments, referring to FIGS. 8A and 8B, each display unit 100 includes four sub-pixels P, and an arrangement order of the emission colors of the four sub-pixels P is, for example, red, green, blue, and white. The arrangement of the sub-pixels P in this structure may increase a brightness of the display unit 100, thereby helping to improve the display effect of the display panel 1.

In some other embodiments, referring to FIG. 1F, for the Nth shift register 130, the twenty-fourth transistor M24 is an output transistor, and a width-to-length ratio of the output transistor is greater than width-to-length ratios of other transistors in the shift register 130 and width-to-length ratios of the transistors in the pixel driver circuit 12. The twenty-fourth transistor M24 is coupled to the output signal terminal OUT<N>, and the output signal terminal OUT<N> is coupled to the pixel driver circuit 12. Therefore, referring to the structural diagrams of the display panel 1 shown in FIGS. 8B and 8C, the second electrode of the twenty-fourth transistor M24 is, for example, coupled to a gate line G1/G2. The gate line G1/G2 is, for example, further coupled to the first gate signal terminal G1 and the second gate signal terminal G2, so as to provide the first gate signal to the first gate signal terminal G1 and provide the second gate signal to the second gate signal terminal G2. The first electrode of the twenty-fourth transistor M24 is, for example, coupled to the connection lines 133, and one of the connection lines 133 is, for example, coupled to the clock signal line $CLKE_1$. When the twenty-fourth transistor M24 is turned on, the clock signal provided by the clock signal line $CLKE_1$ will be transmitted to the gate line G1/G2 through the twenty-fourth transistor M24, and finally enter the pixel driver circuit 12 through the first gate signal terminal G1 and the second gate signal terminal G2 for use by the pixel driver circuit 12. A process of signal transmission from the gate driver circuit 13 to the pixel driver circuit 12 may be realized.

Figure 8C:
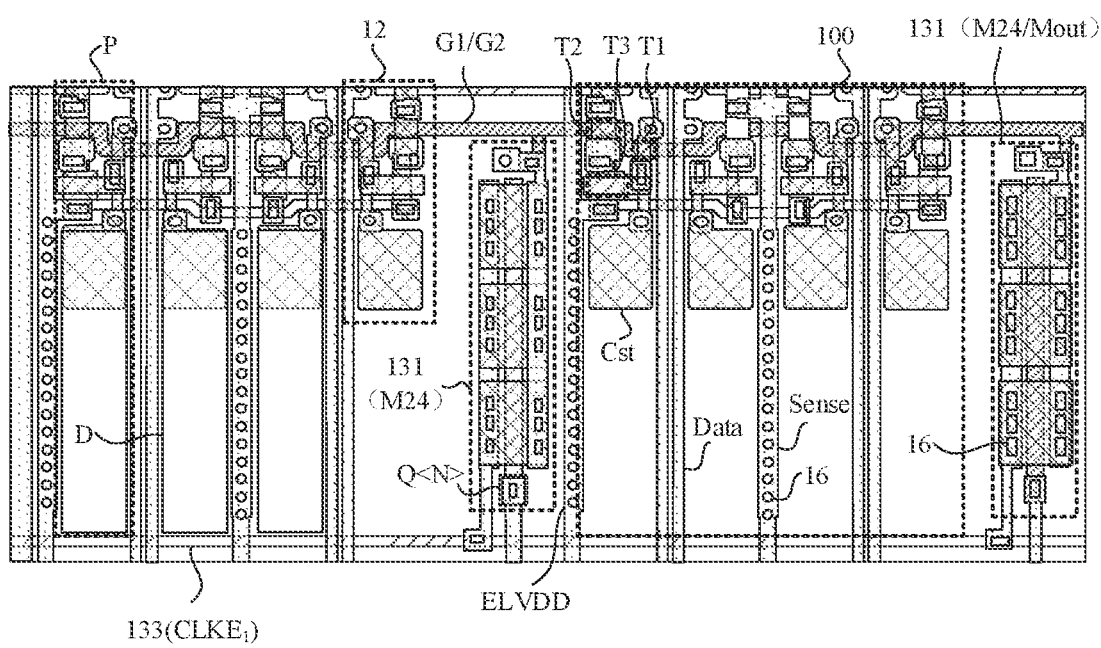

It will be noted that, referring to FIG. 8C, since the connection line 133 is coupled to the clock signal line $CLKE_1$, the signal transmitted by the connection line 133 is the clock signal. In FIG. 8C, some components such as the light-emitting devices D in part of sub-pixels P are omitted to make the structural diagram clear. However, it will be understood by those skilled in the art that, it cannot be considered that there are no light-emitting devices D in the part of sub-pixels P because they are not shown in the figure. The figure is only to reflect some components that need to be described emphatically, and therefore does not reflect all the components in the display panel 1.

The width-to-length ratio of the output transistor is greater than the width-to-length ratios of other transistors, and the larger the width-to-length ratio, the larger a size of the transistor. Therefore, in order to ensure the width-to-length ratio of the output transistor and the aperture ratio of the display panel 1, in some embodiments, referring to FIGS. 8B and 8C, a plurality of twenty-fourth transistors M24 connected in parallel are provided, and "the plurality of" means two or more. Further, for example, if the width-to-length ratio of the output transistor needs to be set as 1000:6 to ensure an output capacity of the output transistor, ten twenty-fourth transistors M24 with the width-to-length ratio of 100:6 may be provided as the output transistors Mout, which may not only ensure properties of the output transistors, but also ensure a small spacing between adjacent sub-pixels P or between adjacent display units 100, and further ensure a large aperture ratio of the display panel 1. It is also possible to set one twenty-fourth transistor M24 with the width-to-length ratio of 1000:6 as the output transistor. In this case, the number of output transistor is small, which may facilitate setting of the circuits.

Based on the description to the output transistor, referring to FIGS. 1D and 1F, it will be understood by those skilled in the art that, any other first thin film transistors 1310 in the equivalent circuit of the shift register 130 may also be realized by connecting multiple thin film transistors in parallel or by providing only one thin film transistor.

In some embodiments, as shown in FIG. 8A, the display panel 1 includes power supply voltage signal lines ELVDD and data signal lines Data. Referring to FIG. 1B, a power supply voltage signal line ELVDD is configured to provide the power supply voltage signal to the power supply voltage signal terminal ELVDD in the pixel driver circuit 12, and a data signal line Data is configured to provide data signals (including the detection data signal and the display data signal) to the data signal terminal Data in the pixel driver circuit 12. The plurality of thin film transistor groups 131 are located in the display region and each are distributed between adjacent sub-pixels P in the same row of sub-pixels, and the plurality of thin film transistor groups 131 include the thin film transistor group(s) 131, in which first thin film transistor(s) are used as the output transistor(s) in the shift register 130.

For example, referring to FIGS. 8B and 8C, each thin film transistor group 131 in which the first thin film transistor(s) are used as the output transistor(s) is located between adjacent display units 100 in the same row of display units 100. Each thin film transistor group 131 in which the first thin film transistor(s) are used as the output transistor(s) includes one first thin film transistor 1310, the one first thin film transistor 1310 is the output transistor Mout, and the output transistor Mout is, for example, the twenty-fourth transistor M24 in the Nth shift register 130.

A spacing between the above thin film transistor group 131 containing the first thin film transistor(s) used as the output transistor(s) and the power supply voltage signal line ELVDD is less than a spacing between the thin film transistor group 131 containing the first thin film transistor(s) used as the output transistor(s) and the data signal line Data. For example, referring to FIG. 8C, a spacing between the twenty-fourth transistor M24 as the output transistor and the power supply voltage signal line ELVDD located on a right side of the twenty-fourth transistor M24 is less than a spacing between the twenty-fourth transistor M24 and the data signal line Data located on the right side of the twenty-fourth transistor M24. As a result, the twenty-fourth transistor M24 is less interfered by a signal transmitted on the data signal line Data, and the operation is stable. It will be noted that when the spacing between the twenty-fourth transistor M24 and the power supply voltage signal line ELVDD and the spacing between the twenty-fourth transistor M24 and the data signal line Data are compared, a first twenty-fourth transistor M24 in a direction from left to right is used. Therefore, the power supply voltage signal line ELVDD and the data signal line Data are both located on the right side of the twenty-fourth transistor M24, and a structure on a right side of another twenty-fourth transistor M24 is the same as a structure on the right side of the first twenty-fourth transistor M24.

In some embodiments, referring to FIGS. 8B and 8C, there are thin film transistor groups 131 used as output transistors, and the thin film transistor groups 131 used as the output transistors are connected in parallel. For example, in FIGS. 8B and 8C, each thin film transistor group 131 used as the output transistor includes one first thin film transistor 1310 (e.g., the twenty-fourth transistor M24). The plurality of twenty-fourth transistors M24 are connected in parallel, so that an overall output capability of the shift register 130 may be ensured, and a size of the twenty-fourth transistors M24 may be made small. Referring to FIGS. 8A and 8C, the display panel 1 is provided with a plurality of via holes 16 therein. For example, a via hole 16 is in a shape of a regular pattern such as a circle, an ellipse, and a rectangle. The via holes 16 are used to realize couplings of film layers in the display panel 1. Positions of the thin film transistor T1, the thin film transistor T2, the thin film transistor T3 and the storage capacitor Cst in the pixel driver circuit 12, and the power supply voltage signal line ELVDD, the data signal line Data, the sensing signal line Sense and the gate line G1/G2 are as shown in FIG. 8C. The pixel driver circuit 12 receives the first gate signal and the second gate signal from the gate line G1/G2, and the gate line G1/G2 is coupled to the twenty-fourth transistor M24, so that the first gate signal and the second gate signal is transmitted from the gate driver circuit 13 to the pixel driver circuit 12.

Figure 8D:
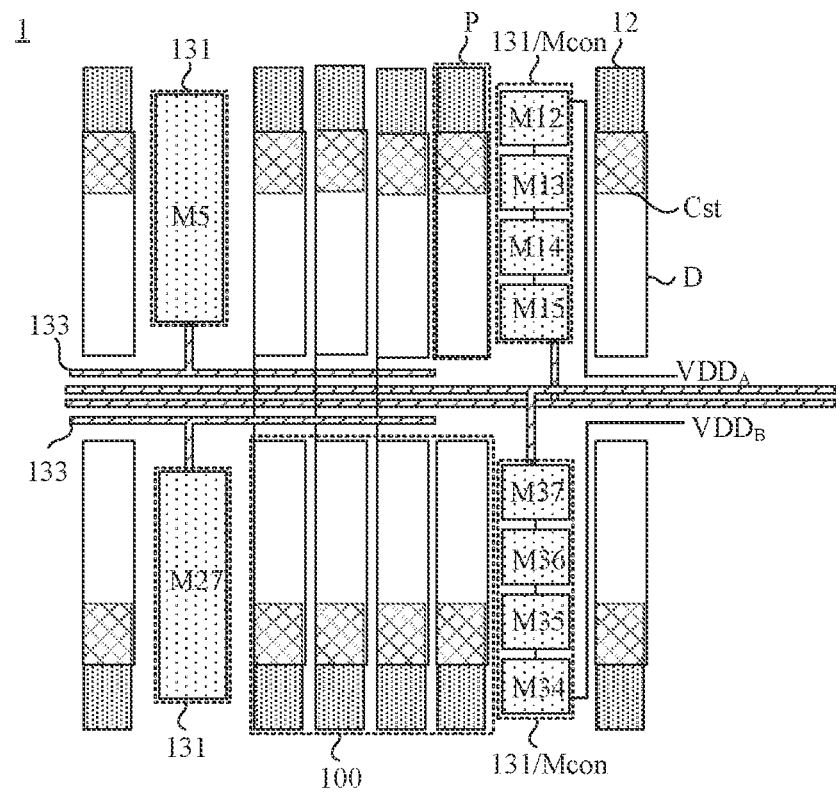

In some embodiments, with reference to FIGS. 1F and 8D, the plurality of thin film transistor groups 131 are located in the display region and each are distributed between adjacent sub-pixels P in the same row of sub-pixels P, and the plurality of thin film transistor groups 131 further include thin film transistor group(s) 131 used as power control transistor(s) Mcon. In the plurality of shift registers 130 that are cascaded, all the thin film transistor groups 131 used as the power control transistors are arranged in a column. For example, referring to FIG. 1F, the twelfth transistor M12, the thirteenth transistor M13, the fourteenth transistor M14, and the fifteenth transistor M15 in the Nth shift register, and the thirty-fourth transistor M34, the thirty-fifth transistor M35, the thirty-sixth transistor M36, and the thirty-seventh transistor M37 in the (N+1)th shift register are used as the power control transistors. The power control transistors in the Nth shift register are used to control the power supply voltage signal to be input into the power supply voltage signal terminal $VDD_A$ of the Nth shift register, the power control transistors in the (N+1)th shift register are used to control the power supply voltage signal to be input into the power supply voltage signal terminal $VDD_B$ of the (N+1)th shift register, and the power supply voltage signal provided by the power supply voltage signal terminal $VDD_A$ and the power supply voltage signal provided by the power supply voltage signal terminal $VDD_B$ are alternately valid signals. Further, referring to FIG. 8D, the twelfth transistor M12, the thirteenth transistor M13, the fourteenth transistor M14, and the fifteenth transistor M15 that are used as the power control transistors Mcon in the Nth shift register, and the thirty-fourth transistor M34, the thirty-fifth transistor M35, the thirty-sixth transistor M36, and the thirty-seventh transistor M37 that are used as the power control transistors Mcon in the (N+1)th shift register are arranged in a column. In an aspect, it is convenient to realize couplings of the power control transistors, and in another aspect, it is convenient to realize couplings of a power control transistor and a power supply voltage signal line $VDD_A$ or $VDD_B$, so that the circuit configuration is simple and clear.

In some embodiments, referring to FIG. 8D, in thin film transistor groups in two adjacent shift registers 130, two thin film transistor groups 131 are arranged in a column and distributed on opposite sides of the connection lines 133, and the two thin film transistor groups 131 belong to different shift registers 130. For example, referring to FIGS. 1F and 8D, the fifth transistor M5 and the twenty-seventh transistor M27 are arranged in a column, and are located on opposite sides of the connection lines 133. Referring to FIG. 1F, the fifth transistor M5 belongs to the Nth shift register, and the twenty-seventh transistor M27 belongs to the (N+1)th shift register. The fifth transistor M5 and the twenty-seventh transistor M27 are arranged in the column, and thus it is beneficial to make the spacing between adjacent display units 100 small, thereby facilitating an increase in the aperture ratio of the display panel 1. Moreover, heat dissipation performances of the fifth transistor M5 and the twenty-seventh transistor M27 may be improved, and thus a service life of the display panel 1 may be prolonged.

Figure 8E:
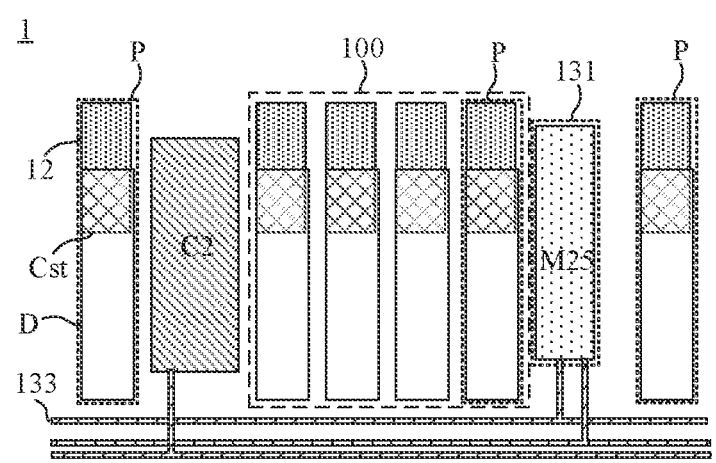

In some embodiments, referring to FIG. 8E, in an extension direction of a row of sub-pixels, spacings between at least one thin film transistor group 131 and two sub-pixels P located on opposite sides of the at least one thin film transistor group 131 are unequal. For example, referring to FIG. 8E, the spacings between the twenty-fifth transistor M25 and the sub-pixels P on left and right sides of the twenty-fifth transistor M25 are not equal. For example, the twenty-fifth transistor M25 is closer to the sub-pixel P on the left side thereof than to the sub-pixel P on the right side thereof.

In some embodiments, referring to FIGS. 1F and 8E, at least one capacitor included in the shift register 130 is located in the display region 10 and distributed between adjacent sub-pixels P in the same row of sub-pixels P. In an extension direction of a row of sub-pixels, spacings between the at least one capacitor and two sub-pixels P located on opposite sides of the at least one capacitor are substantially the same.

For example, in FIG. 1F, the Nth shift register includes the first capacitor C1 and the second capacitor C2. Further, referring to FIG. 8E, spacings between the second capacitor C2 and sub-pixels P located on left and right sides of the second capacitor C2 are substantially same, so that it is possible to prevent the sub-pixels P located on both sides of the second capacitor C2 from causing different interferences to the second capacitor C2.

In some embodiments, all the first thin film transistors 1310 and the plurality of capacitors in the shift register 130 each are located between adjacent sub-pixels P in the same row of sub-pixels P, or located between adjacent display units 100 in the same row of display units 100. In this case, it is possible to reduce a width of the bezel of the display panel 1 to a greatest extent, and realize an effect of the narrow bezel or even bezel-less of the display panel 1.

Figure 9:
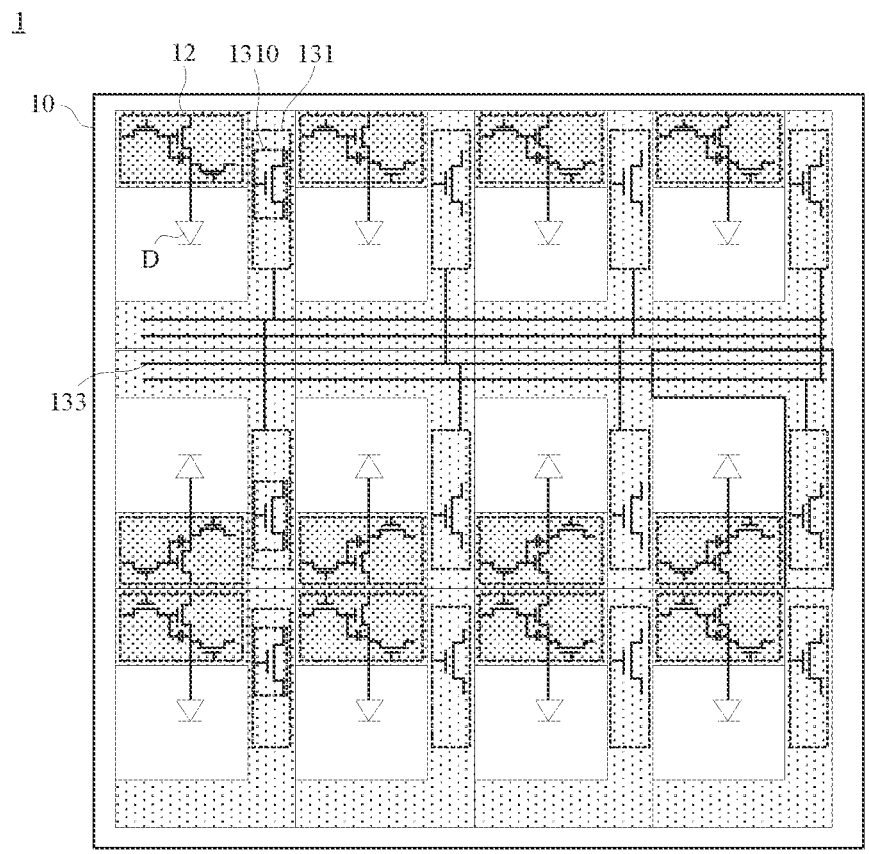
FIG. 9 is a diagram showing a structure of another display panel, in accordance with some embodiments of the present disclosure.

In some embodiments, referring to FIG. 9, in the two adjacent rows of sub-pixels P, light-emitting devices D in different rows are adjacent, or pixel driver circuits 12 in different rows are adjacent. In a case where the display panel 1 includes connection lines 133, the connection lines 133 each are located between different rows of light-emitting devices D in the two adjacent rows of sub-pixels P. With this structure, connection lines 133 coupled to the thin film transistor groups 131 in two adjacent rows may be arranged together, which facilitates the setting of the connection lines 133, so that the wiring of the gate driver circuit 13 is clear.

On this basis, in some embodiments, referring to FIG. 9, the shift registers 130 in two adjacent rows share at least one of the plurality of connection lines 133. The thin film transistor groups 131 in two adjacent rows share the same connection line 133, so that the spacing between the two adjacent rows of sub-pixels may be reduced, and the PPI of the display panel 1 may be improved.

In some embodiments, the light emitted by the light-emitting device D exits toward a side away from the base substrate. The display panel 1 with this structure is a top-emission display panel. In the top-emission display panel, an orthographic projection, on the base substrate, of a portion of the gate driver circuit 13 located in the display region 10 may overlap with the orthographic projection of the light-emitting device D on the base substrate, and the aperture ratio of the display panel 1 will not be affected.

Figure 10:
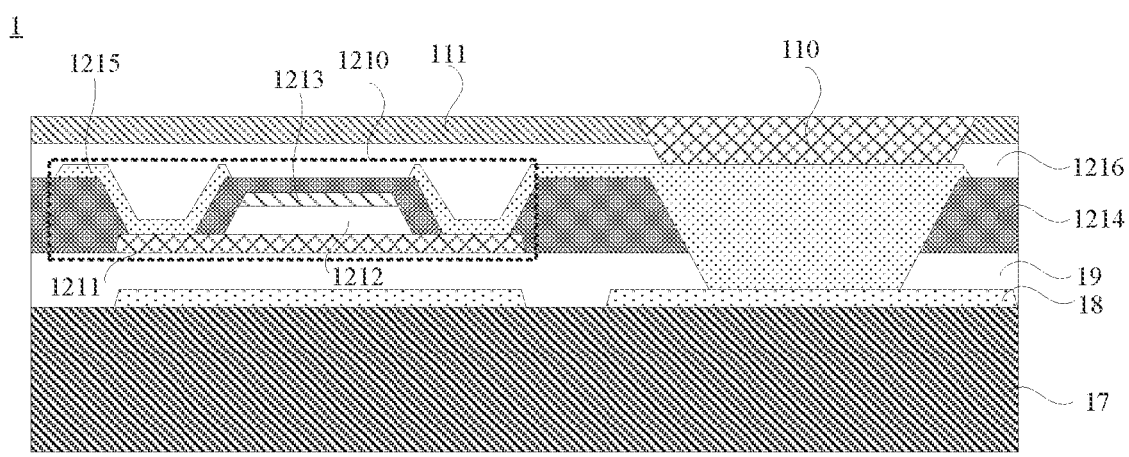
FIG. 10 is a diagram showing a structure of a longitudinal section of a display panel, in accordance with some embodiments of the present disclosure.

Regardless of whether the display panel 1 is a bottom-emission display panel or a top-emission display panel, a structure of the display panel 1 is, for example, as shown in FIG. 10. In a thickness direction of the display panel 1, the display panel 1 includes a light-shielding layer 18, a buffer layer 19, thin film transistors 1210, anodes 110, and a planarization layer 111 that are disposed on the base substrate 17. A thin film transistor 1210 is the driving transistor T3 in the pixel driver circuit 12. For example, the thin film transistor 1210 includes a first active layer 1211, a first gate insulating layer 1212, a first gate 1213, a portion of an interlayer insulating layer 1214 located in a region where the thin film transistor 1210 is located, a source-drain layer (SD layer) 1215, and a portion of a passivation layer 1216 located in a region where the thin film transistor 1210 is located.

A material of the light-shielding layer 18 is, for example, a light-shielding material; and the light-shielding material is, for example, a black matrix material or a metal material. In FIG. 10, a metal material is taken as an example, the light-shielding layer 18 needs to be coupled to the SD layer to form a structure similar to a structure with upper-lower double channels, which may improve an electrical performance of the thin film transistor 1210. The light-shielding layer 18 is configured to prevent light entering from the base substrate 17 from affecting the first active layer 1211 and further affecting a performance of the thin film transistor 1210.

A material of the first active layer 1211 is, for example, metal oxide, polysilicon, or amorphous silicon. The metal oxide is, for example, indium gallium zinc oxide.

A material of the first gate 1213 is, for example, a metal material, such as molybdenum, titanium, copper, silver, or aluminum. A structure of the first gate 1213 is, for example, a single-layer structure.

A material of the SD layer 1215 is, for example, a metal material, such as molybdenum, titanium, copper, silver, or aluminum. A structure of the SD layer 1215 may be a single-layer structure or a laminated structure.

Materials of the buffer layer 19, the first gate insulating layer 1212, the interlayer insulating layer 1214, and the passivation layer 1216 are all, for example, inorganic insulating materials, such as at least one of silicon oxide ($SiO_x$) and silicon nitride (SiN).

A material of the anode 110 is, for example, a conductive material, such as ITO. The anode 110 may have a single-layer structure or a laminated structure.

A material of the planarization layer 111 is, for example, an organic substance, such as polyimide (PI). The planarization layer 111 has a flattening effect.

In the embodiments of the present disclosure, at least one thin film transistor group 131 included in the gate driver circuit 13 of the display panel 1 is disposed in the display region 10, which is beneficial for the display panel 1 in the embodiments of the present disclosure to realize a narrow bezel or even bezel-less effect.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel having a display region, the display panel comprising:
    a base substrate;
    a plurality of rows of sub-pixels disposed on the base substrate and located in the display region, each row of sub-pixels including a plurality of sub-pixels, and each sub-pixel including a pixel driver circuit and a light-emitting device coupled to the pixel driver circuit; and
    at least one gate driver circuit disposed on the base substrate, a gate driver circuit including a plurality of shift registers that are cascaded and a plurality of control signal lines, a shift register being coupled to a plurality of pixel driver circuits in at least one row of sub-pixels and at least a part of the plurality of control signal lines, and the shift register being configured to provide at least one gate signal to the plurality of pixel driver circuits under control of control signal lines coupled to the shift register, wherein
    the shift register includes a plurality of first thin film transistors, the plurality of first thin film transistors are divided into a plurality of thin film transistor groups, and at least one thin film transistor group is located in the display region and distributed between adjacent sub-pixels in a same row of sub-pixels.

2. The display panel according to claim 1, wherein at least one of the plurality of control signal lines is located in the display region and in a region outside regions occupied by pixel driver circuits in the display region; and/or
    at least one of the plurality of control signal lines is located between two adjacent columns of sub-pixels, and a column of sub-pixels includes sub-pixels with a same arrangement order in the rows of sub-pixels; and/or
    at least two of the plurality of control signal lines are located in the display region and in a region outside regions occupied by pixel driver circuits in the display region, and at least one sub-pixel is disposed between any two of the at least two control signal lines.

3. The display panel according to claim 1, wherein each of the thin film transistor groups included in the shift register is located between adjacent sub-pixels in the same row of sub-pixels, and at least one sub-pixel is disposed between any two thin film transistor groups in an extension direction of a row of sub-pixel; and/or
    in an extension direction of a row of sub-pixels, spacings between at least one thin film transistor group and two sub-pixels located on opposite sides of the at least one thin film transistor group are unequal.

4. The display panel according to claim 2, wherein in the at least one thin film transistor group and the at least one control signal line that are located in the display region, a thin film transistor group and a control signal line have at least one sub-pixel therebetween.

5. The display panel according to claim 1, further comprises:
    a plurality of connection lines corresponding to a row of sub-pixels, wherein
    a connection line is coupled to at least two thin film transistor groups in a shift register coupled to a pixel driver circuits in the row of sub-pixels, or coupled to one control signal line and at least one thin film transistor group that is in a shift register coupled to pixel driver circuits in the row of sub-pixels.

6. The display panel according to claim 5, wherein in thin film transistor groups in two adjacent shift registers, two thin film transistor groups are arranged in a column and distributed on opposite sides of a connection line, and the two thin film transistor groups belong to different shift registers.

7. The display panel according to claim 1, further comprising:
    at least one electrostatic discharge pattern, and
    at least one second thin film transistor, wherein
    a second thin film transistor includes a gate, a first electrode and a second electrode, the first electrode of the second thin film transistor is coupled to a control signal line, and the second electrode of the second thin film transistor is coupled to an electrostatic discharge pattern.

8. The display panel according to claim 7, wherein the at least one second thin film transistor includes a plurality of second thin film transistors, first electrodes of the plurality of second thin film transistors are coupled to different control signal lines, and second electrodes of the plurality of second thin film transistors are coupled to a same electrostatic discharge pattern; and/or the at least one electrostatic discharge pattern includes a plurality of electrostatic discharge patterns, and the at least one second thin film transistor includes a plurality of second thin film transistors; an electrostatic discharge pattern is at least coupled to one second thin film transistor; and ends of the plurality of electrostatic discharge patterns are configured to be couples to a same fixed voltage terminal to discharge static electricity on the electrostatic discharge patterns.

9. The display panel according to claim 1, wherein no control signal line is disposed between any two thin film transistor groups; and/or a control signal line is coupled to at least one thin film transistor group, no other thin film transistor groups and/or other control signal lines are disposed between the control signal line couples to the at least one thin film transistor group and the at least one thin film transistor group.

10. The display panel according to claim 1, wherein each row of sub-pixels is divided into a plurality of display units, each display unit includes at least two sub-pixels; and each thin film transistor group, located in the display region, of the shift register is located between adjacent display units.

11. The display panel according to claim 10, wherein at least one of the plurality of control signal lines is located in the display region and in a region outside regions occupied by pixel driver circuits in the display region, at least one of the plurality of control signal lines is located between two adjacent columns of display units, and a column of display units includes display units with a same arrangement order in rows of display units.

12. The display panel according to claim 1, wherein light emitted by the light-emitting device exits through the base substrate; and an orthographic projection, on the base substrate, of a portion of the gate driver circuit located in the display region does not overlap with orthographic projections, on the base substrate, of the light-emitting device and the pixel driver circuit.

13. The display panel according to of claim 5, wherein in the two adjacent rows of sub-pixels, light-emitting devices in different rows are adjacent, or pixel driver circuits in different rows are adjacent; and the connection lines are located between different rows of light-emitting devices in the two adjacent rows of sub-pixels.

14. The display panel according to claim 13, wherein shift registers in two adjacent rows share at least one of the plurality of connection lines.

15. The display panel according to claim 1, wherein the at least one thin film transistor group includes multiple first thin film transistors, and the multiple first thin film transistors are arranged in a column.

16. The display panel according to claim 1, further comprising power supply voltage signal lines and data signal lines; a power supply voltage signal line and a data signal line being coupled to the pixel driver circuit, wherein the plurality of thin film transistor groups are located in the display region and each are distributed between adjacent sub-pixels in the same row of sub-pixels, and the plurality of thin film transistor groups include at lease one film transistor group, in which one or more first thin film transistors are used as one or more output trasistors in the shift register; and a spacing between the power supply voltage line and a thin film transistor group containing the one or more first thin film transistors used as the one or more output transistors is less than a spacing between the data signal line and the first thin film transistor group containing the one or more first thin transistors used as the one or more output transistors and the data signal line.

17. The display panel according to claim 16, wherein the at least one thin film transistor group, in which the one or more first thin film transistors are used as the one or more output transistors, includes multiple thin film transistor groups, each thin film transistor group includes a single first thin film transistor used as an output transistor, and first thin film transistors in the multiple thin film transistor groups are connected in parallel.

18. The display panel according to claim 16, wherein the plurality of thin film transistor groups located in the display region and each distributed between the adjacent sub-pixels in the same row of sub-pixel further include at least one first thin film transistor group, in which one or more first thin transistors are used as one or more power control transistors;

in the plurality of shift registers that are cascaded, all thin film transistor groups each containing the one or more first film transistors used as the one or more power control transistors are distributed in a column.

19. The display panel according to claim 1, wherein the shift register further includes at least one capacitor, and the at least one capacitor is located in the display region and distributed between adjacent sub-pixels in the same row of sub-pixels; and/or the shift register further includes at least one capacitor, and the at least one capacitor is located in the display region and distributed between adjacent sub-pixels in the same row of sub-pixels; in an extension direction of a row of sub-pixels, spacings between the at least one capacitor and two-sub pixels located on opposite sides of the at least one capacitor are substantially same.

20. A display apparatus, comprising the display panel according to claim 1.

* * * * *

UNITED STATES PATENT AND TRADEMARK OFFICE
CERTIFICATE OF CORRECTION

PATENT NO.        : 11,935,484 B2
APPLICATION NO.   : 17/642983
DATED             : March 15, 2022
INVENTOR(S)       : Xuehuan Feng and Yongqian Li Page 1 of 1

It is certified that error appears in the above-identified patent and that said Letters Patent is hereby corrected as shown below:

In the Claims (1) In Column 43 (Claim 8), Line 14, "be couples to" should be "be coupled to";

(2) In Column 43 (Claim 9), Line 23, "couples to" should be "coupled to";

(3) In Column 43 (Claim 13), Line 48, the word "of" in "according to of" should be deleted;

(4) In Column 44 (Claim 16), Line 13 and 16, "at lease one film transistor" should be "at least one thin film transistor", and "the power supply voltage line" should be "the power supply voltage signal line";

(5) In Column 44 (Claim 16), Line 20, In "the first thin film transistor group", the word "first" should be deleted;

(6) In Column 44 (Claim 19), Line 46, 47 and 51, "capacitator" should be "capacitor", and "two-sub pixels" should be "two sub-pixels".

Signed and Sealed this
Second Day of July, 2024

Katherine Kelly Vidal
*Director of the United States Patent and Trademark Office*